US012557359B2

(12) United States Patent
Xie et al.

(10) Patent No.: US 12,557,359 B2
(45) Date of Patent: Feb. 17, 2026

(54) SELF-ALIGNED BACKSIDE CONTACT WITH PROTRUDING SOURCE/DRAIN

(71) Applicant: International Business Machines Corporation, Armonk, NY (US)

(72) Inventors: Ruilong Xie, Niskayuna, NY (US); Kisik Choi, Watervliet, NY (US); Chanro Park, Clifton Park, NY (US); Shogo Mochizuki, Mechanicville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 18/329,668

(22) Filed: Jun. 6, 2023

(65) Prior Publication Data

US 2024/0413201 A1   Dec. 12, 2024

(51) Int. Cl.
| | |
|---|---|
| H01L 29/06 | (2006.01) |
| H01L 21/768 | (2006.01) |
| H01L 21/8234 | (2006.01) |
| H01L 23/528 | (2006.01) |
| H01L 23/535 | (2006.01) |
| H01L 29/423 | (2006.01) |
| H01L 29/66 | (2006.01) |
| H01L 29/786 | (2006.01) |
| H10D 30/01 | (2025.01) |
| H10D 30/67 | (2025.01) |
| H10D 62/10 | (2025.01) |
| H10D 84/01 | (2025.01) |
| H10D 84/03 | (2025.01) |

(52) U.S. Cl.
CPC ...... *H10D 62/121* (2025.01); *H01L 21/76897* (2013.01); *H01L 23/5286* (2013.01); *H01L 23/535* (2013.01); *H10D 30/014* (2025.01); *H10D 30/6735* (2025.01); *H10D 30/6757* (2025.01); *H10D 84/0149* (2025.01); *H10D 84/038* (2025.01)

(58) Field of Classification Search
CPC ............... H10D 62/121; H10D 30/014; H10D 30/6735; H10D 30/6757; H10D 84/0149; H10D 84/038; H10D 30/43; H10D 62/151; H10D 84/017; H10D 84/0186; H10D 84/85; H01L 21/76897; H01L 23/5286; H01L 23/535
USPC .......................................................... 257/9
See application file for complete search history.

(56) References Cited

U.S. PATENT DOCUMENTS

| | | | |
|---|---|---|---|
| 8,981,344 B2 | 3/2015 | Jain | |
| 9,331,080 B2 | 5/2016 | Eom | |
| 10,797,139 B2 | 10/2020 | Morrow | |
| 11,398,553 B2 | 7/2022 | Lin | |
| 11,532,556 B2 | 12/2022 | Huang | |
| 2011/0084308 A1 | 4/2011 | Loh | |

(Continued)

*Primary Examiner* — Tong-Ho Kim
(74) *Attorney, Agent, or Firm* — Gavin Giraud

(57) ABSTRACT

Aspects of the present invention provide a semiconductor structure. The semiconductor structure may include a PFET source/drain (S/D). The PFET S/D may include a silicon germanium (SiGe)-based epi protruding through a BILD plane between a backside interlayer dielectric (BILD) and a first gate, and an NFET S/D. The NFET S/D may include a silicon (Si)-based epi protruding into the BILD plane and a SiGe epi between the BILD and the Si-based.

17 Claims, 29 Drawing Sheets

(56) References Cited

U.S. PATENT DOCUMENTS

| | | |
|---|---|---|
| 2021/0111115 A1 | 4/2021 | Patrick |
| 2021/0134721 A1 | 5/2021 | Chiang |
| 2021/0202385 A1 | 7/2021 | Huang |
| 2021/0305252 A1 | 9/2021 | Chiang |
| 2021/0305381 A1 | 9/2021 | Chiang |
| 2021/0351303 A1 | 11/2021 | Ju |
| 2021/0376071 A1 | 12/2021 | Liu |
| 2021/0376093 A1 | 12/2021 | Chu |
| 2022/0093512 A1* | 3/2022 | Chang .................... H10D 30/62 |
| 2022/0336287 A1 | 10/2022 | Yu |
| 2022/0367705 A1 | 11/2022 | Yu |
| 2024/0096699 A1* | 3/2024 | Zhang ................. H01L 23/5286 |

\* cited by examiner

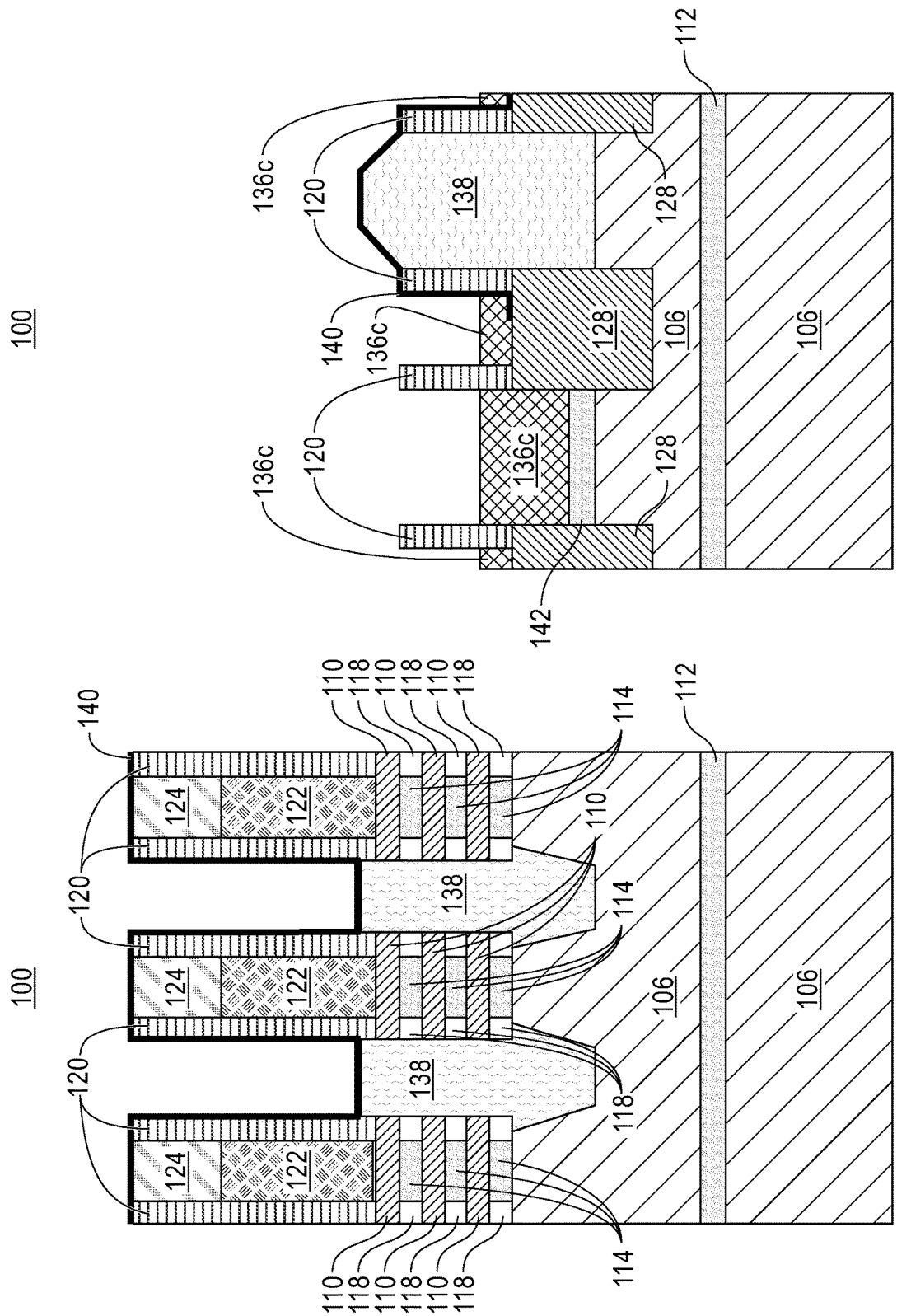

SELF-ALIGNED BACKSIDE CONTACT WITH PROTRUDING SOURCE/DRAIN

BACKGROUND

The present invention relates generally to the field of semiconductor fabrication, and more particularly to source/drain epis that protrude into the backside interlayer dielectric.

A self-aligned backside contact (SAB) is a technique used in semiconductor device manufacturing to create an electrical contact to the backside of a device, without interfering with the circuitry on the front side. The process involves several steps, including creation of front-side features such as gate structures or other active device components; deposition of insulating layer; creation of contact holes exposing the backside of the device at specific locations; deposition of metal layer; and removal of excess metal, creating the backside contact. This can be done using a combination of etching and chemical-mechanical polishing (CMP).

The key to the SAB process is that the backside contact is self-aligned to the contact hole, meaning that it is automatically positioned in the correct location without the need for additional alignment steps. This improves the accuracy and reliability of the contact, which is important for high-performance semiconductor devices. During fabrication of the SAB, a bottom dielectric isolation (BDI) isolates the active device regions from the underlying substrate. The BDI layer is typically made of a dielectric material, such as silicon dioxide or silicon nitride, and is located between the active device regions and the substrate. In the context of self-aligned backside contact (SAB) fabrication, the BDI layer can play an important role in the process. Specifically, the BDI layer can act as a mask during the etching of the contact holes through the substrate, allowing for precise alignment of the contact holes to the active device regions.

SUMMARY

In one aspect, the present invention provides a semiconductor structure. The semiconductor structure may include a PFET source/drain (S/D). The PFET S/D may include a silicon germanium (SiGe)-based epi protruding through a BILD plane between a backside interlayer dielectric (BILD) and a first gate, and an NFET S/D. The NFET S/D may include a silicon (Si)-based epi protruding into the BILD plane and a SiGe epi between the BILD and the Si-based.

In another aspect, the present invention provides a method of fabricating a semiconductor structure. The method may include forming nanosheet fins above a substrate at a first critical dimension (CD) and forming a first recess in the substrate between a first pair of the nanosheet fins. The first recess may include a second CD below the nanosheet fins. The method may also include forming a silicon germanium (SiGe) liner within the recess and forming a NFET epi within the SiGe epi.

In yet another aspect, the present invention provides a semiconductor structure. The semiconductor structure may include an NFET source/drain (S/D) with a silicon (Si)-based epi protruding into a BILD plane between a backside interlayer dielectric (BILD) and a first gate, and a SiGe epi between the BILD and the Si-based epi. The semiconductor structure may also include a backside NFET contact electrically connecting the NFET S/D to a backside power delivery network.

BRIEF DESCRIPTION OF THE DRAWINGS

FIGS. 11A-11C depict cross-sectional side views of a semiconductor structure at one stage of fabrication, in accordance with one embodiment of the present invention.

DETAILED DESCRIPTION

Figure 2:
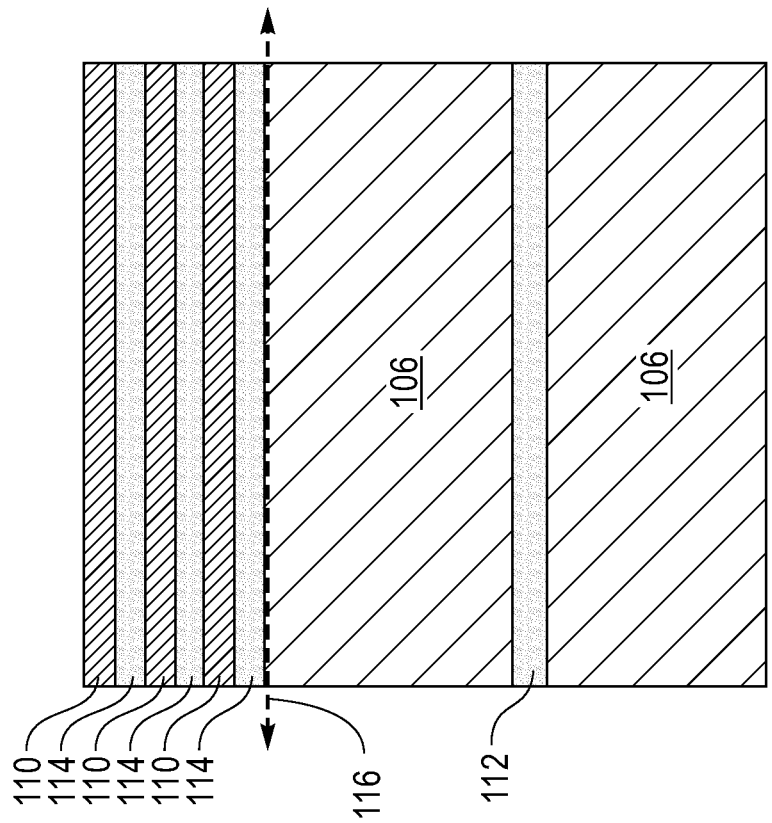
FIG. 2 depicts a cross-sectional side view of a semiconductor structure at a stage of fabrication, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, row 102 may refer to a row 102 or multiple rows 102.

The present invention will now be described in detail with reference to the Figures.

Figure 1:
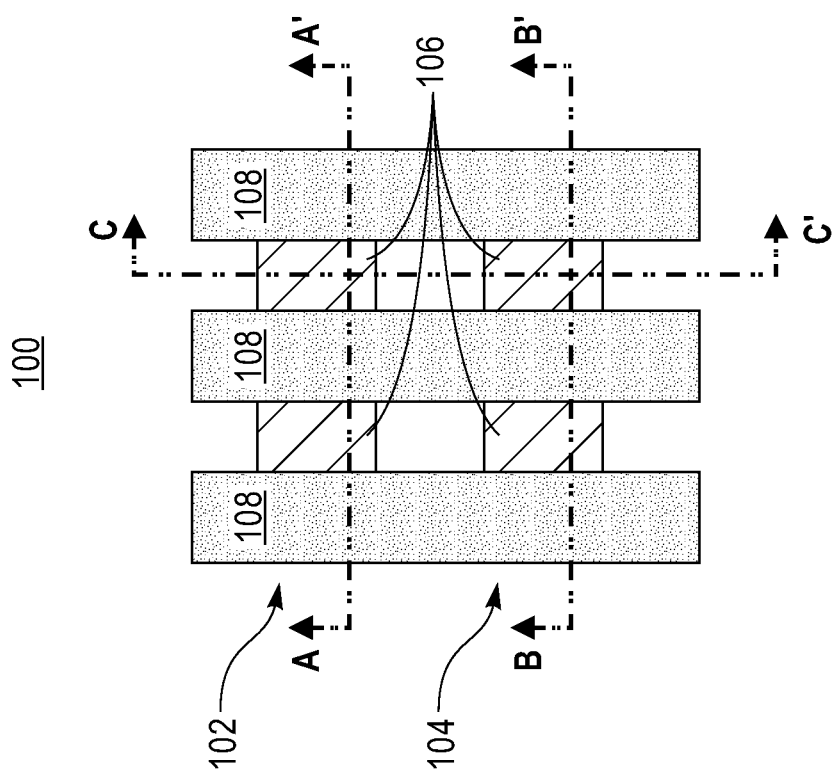
FIG. 1 depicts a schematic top view depicting a semiconductor structure, in accordance with one embodiment of the present invention.

Referring now to the figures, FIG. 1 depicts a schematic top view depicting a semiconductor structure 100, in accordance with one embodiment of the present invention. The illustrated stage of the semiconductor structure 100 includes an NFET row 102 and a PFET row 104. The NFET row 102 and the PFET row 104 represent limited examples of a circuit that may include many hundreds or thousands of rows. The semiconductor structure 100 may also include gates 108 that cross the NFET row 102 and the PFET row 104. The gates 108 cross the NFET row 102 and the PFET row 104 between source/drains (S/Ds) 106 to form individual field-effect transistors (FETs) in the NFET row 102 and the PFET row 104 to control signal flow along the rows 102, 104. The FETs, once formed, are electrically connected to power and signal networks through S/D contacts (not illustrated in FIG. 1) that are etched and metalized as part of the fabrication of the semiconductor structure 100. The dimensions of the NFETs and PFETs are small, such that tiny misalignment of the contacts during etching can result in shorting and defects. To reduce the likelihood of defects caused by shorting, the embodiments disclosed below include S/Ds that protrude through a BILD plane to increase the distance between the S/D contacts and a high-κ metal gate material in each gate 108. The semiconductor structure 100 may further include a silicon-germanium (SiGe) liner that enables a silicon (Si)-based epi to be formed with the same protrusion through the BILD plane. An example process is illustrated in the stages described below.

FIG. 2 depicts a cross-sectional side view of the semiconductor structure 100 at a stage of fabrication, in accordance with one embodiment of the present invention. The view of FIG. 2 is shown in FIG. 1 as lines A-A'. The semiconductor structure 100 is fabricated on a substrate 106, which may include an etch-stop layer 112 to decrease the likelihood of damage during removal of the substrate 106 at a later stage. The substrate 106 may include silicon, but other materials may also be used. Above the substrate 106, The illustrated stage of the semiconductor structure 100 includes layers that will become the nanosheet channels 110 for both the PFET devices and the NFET devices. The nanosheet layers may be fabricated, for example, by forming epitaxial blanket semiconductor layers sequentially above the bottom-most semiconductor layer above the substrate 106. Initially, a layer of silicon and a layer of SiGe etch stop layer 112 may be epitaxially grown above the silicon substrate 106. Then the layers may epitaxially grown using alternating SiGe dummy layers 114 and nanosheet channels 110 of silicon. Other methods may be used to form the nanosheet channels 110 and the dummy layers 114. Certain embodiments may also include other forms of transistors.

While some semiconductor structures may include a bottom dielectric isolation (BDI) layer to isolate the active region, forming a BDI requires additional processing steps early in device fabrication, which increases cost and may introduce defects. Thus, a SAB solution without using BDI is attractive. For embodiments of the semiconductor structure 100 disclosed herein, the BDI is unnecessary due to the formation of the S/Ds below a BILD plane 116. This positioning of the S/Ds (i.e., between the nanosheet channels 110 and a protruding into a backside interlayer dielectric (BILD)) provides the functionality of the BDI, without the additional costly fabrication steps. It is understood that the nanosheet channels 110 can include any number of nanosheets alternating with a corresponding number of sacrificial dummy layers 114. For example, the nanosheet channels 110 can include two nanosheets, five nanosheets, eight nanosheets, thirty nanosheets (e.g., 3D NAND), or any number of nanosheets, along with a corresponding number of sacrificial dummy layers 114. The nanosheet channels 110 can be made of any suitable material such as, for example, monocrystalline silicon or silicon germanium. In some embodiments, the nanosheet channels 110 are silicon nanosheets. In some embodiments, the nanosheet channels 110 have a thickness of about 4 nm to about 15 nm, for example 10 nm, although other thicknesses are within the contemplated scope of the present disclosure. In some embodiments, the substrate 106 and the nanosheet channels 110 can be made of a same semiconductor material. In other embodiments, the substrate 106 can be made of a first semiconductor material, and the nanosheet channels 110 can be made of a second and/or third semiconductor material.

Figure 3A:
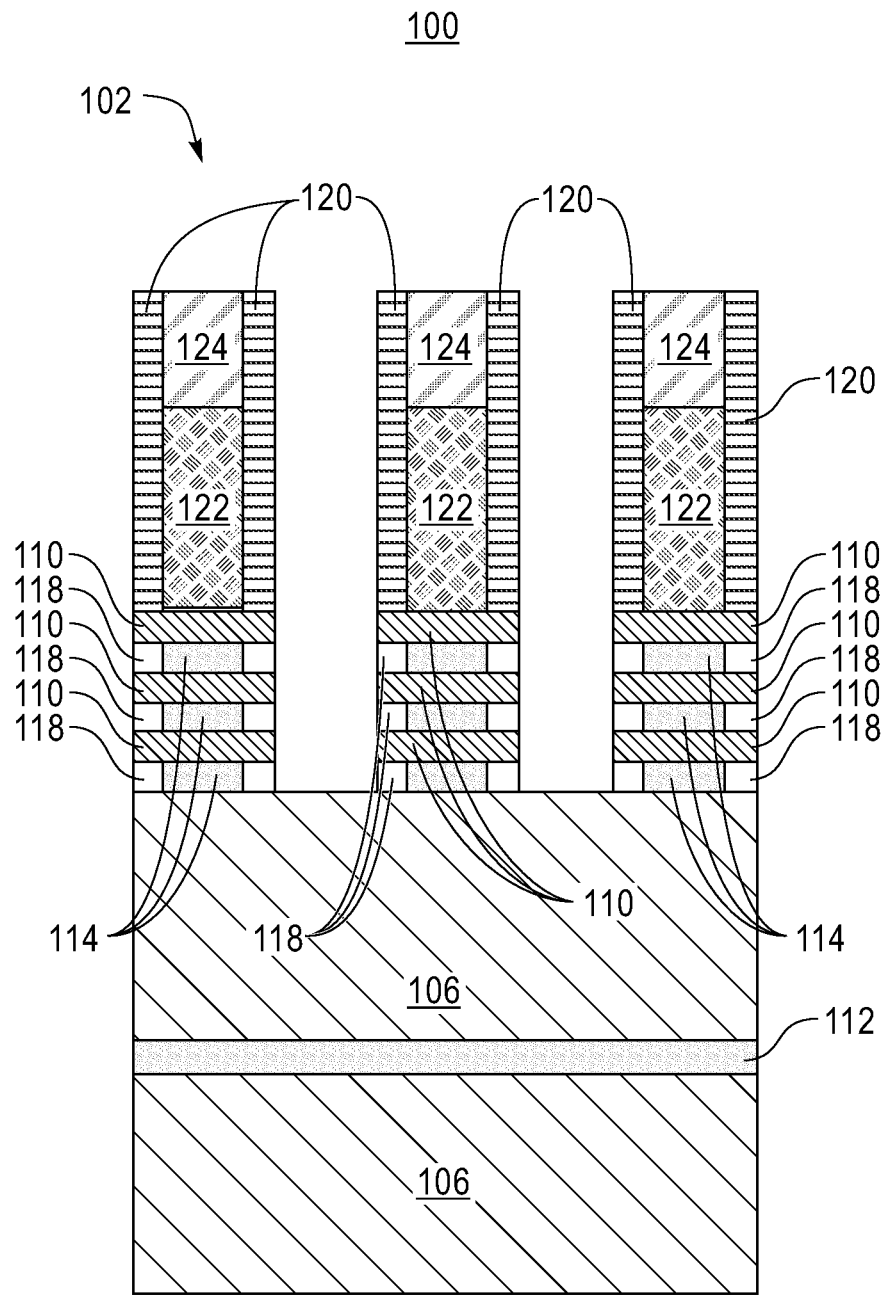
FIGS. 3A-3C depict cross-sectional side views of a semiconductor structure at one stage of fabrication, in accordance with one embodiment of the present invention.
Figure 3C:
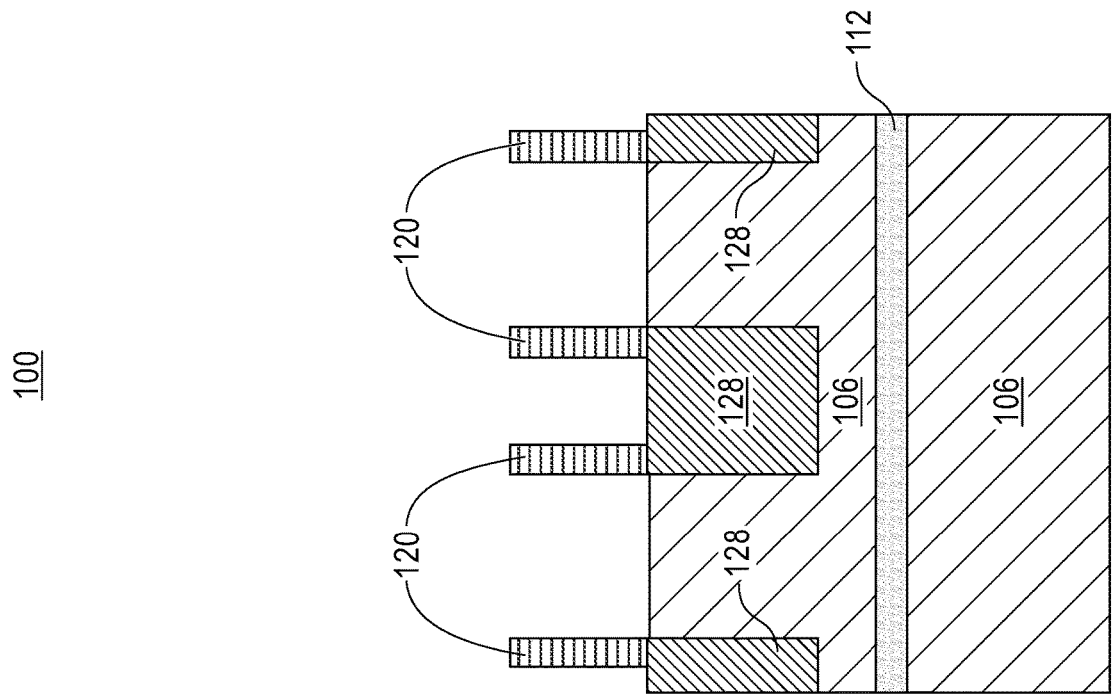
Figure 3B:
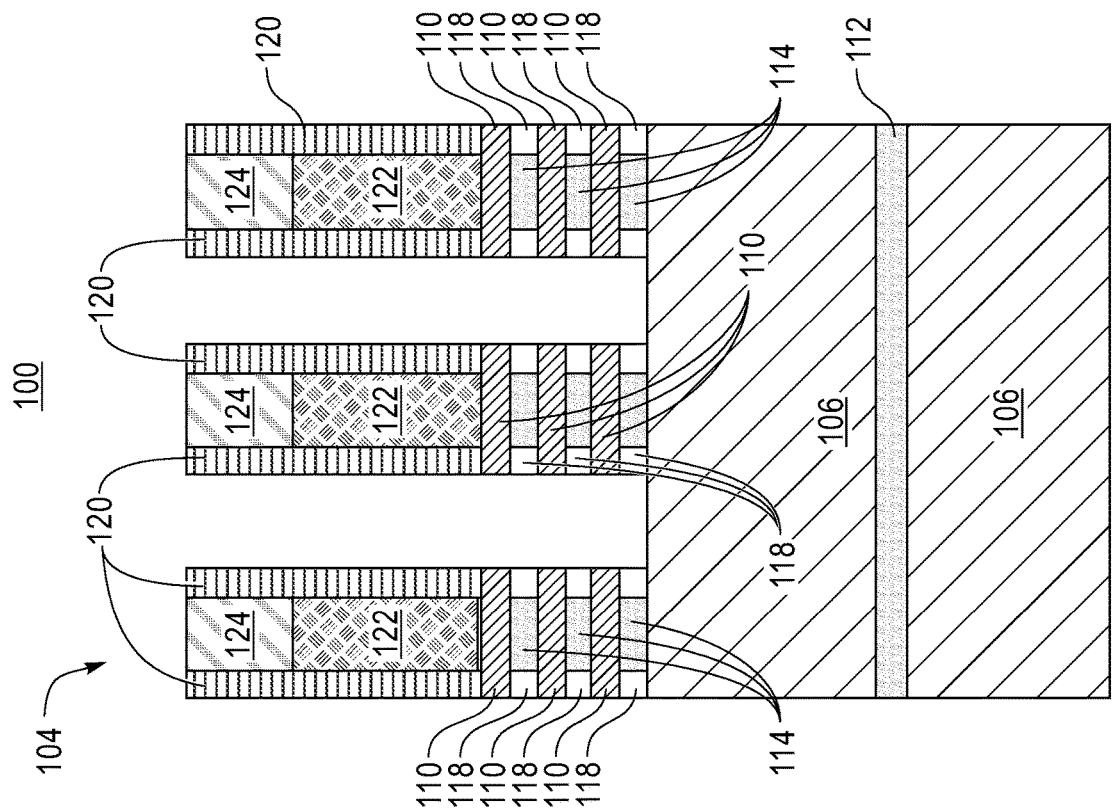

Once the silicon layers for the nanosheet channels 110 and the SiGe dummy layers 114 are fabricated, individual fins may be cut or etched with source/drains (S/Ds) grown on each side of the fin, as shown in FIGS. 3A-3C.

FIGS. 3A-3C depict cross-sectional side views of the semiconductor structure 100 at one stage of fabrication, in accordance with one embodiment of the present invention. The cross-sectional views are indicated in FIG. 1: FIG. 3A is a view along line A-A', FIG. 3B is a view along line B-B', and FIG. 3C is a view along line C-C'. Once the silicon layers for the nanosheet channels 110 and the dummy layers 114 are fabricated, individual fins may be cut or etched. The fins, at this stage of fabrication, are the same for the NFET row 102 (shown in FIG. 3A) and for the PFET row 104 (shown in FIG. 3B). After fin patterning, shallow trench isolation 128 is formed between different fins. Then dummy gate 122 (with gate hardmask 124) is formed followed by formation of the gate spacer 120. The exposed nanosheets not covered by dummy gate 122 or gate spacer 120 are recessed, followed by SiGe indentation and inner spacer 118 formation. The inner spacers 118 may include nitride based material such as silicon boron carbide nitride (SiBCN), SiOCN, SIN, SiOC, etc., or other non-nitride based masking materials.

Other components of the semiconductor structure 100 include shallow trench isolations (STI) 126 between the gate regions of the substrate 106. The STI 126 isolates each of the NFET rows 102 and PFET rows 104 from other devices in the semiconductor structure 100. The STI 126 may include a dielectric material, typically silicon dioxide, deposited into trenches (e.g., formed using patterning and etch processes) using a chemical vapor deposition (CVD) or a spin-on-glass (SOG) technique.

Figure 4A:
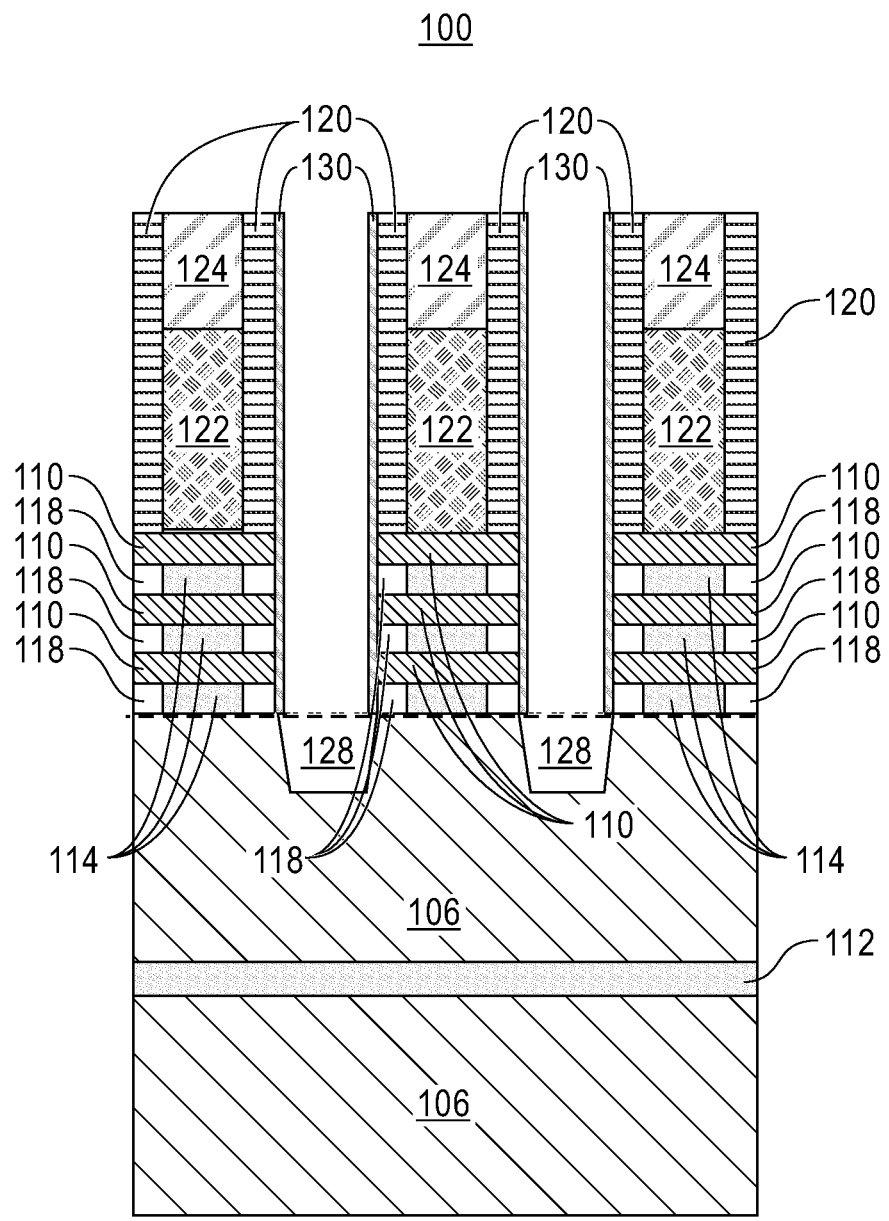
FIGS. 4A-4C depict cross-sectional side views of a semiconductor structure at one stage of fabrication, in accordance with one embodiment of the present invention.
Figure 4C:
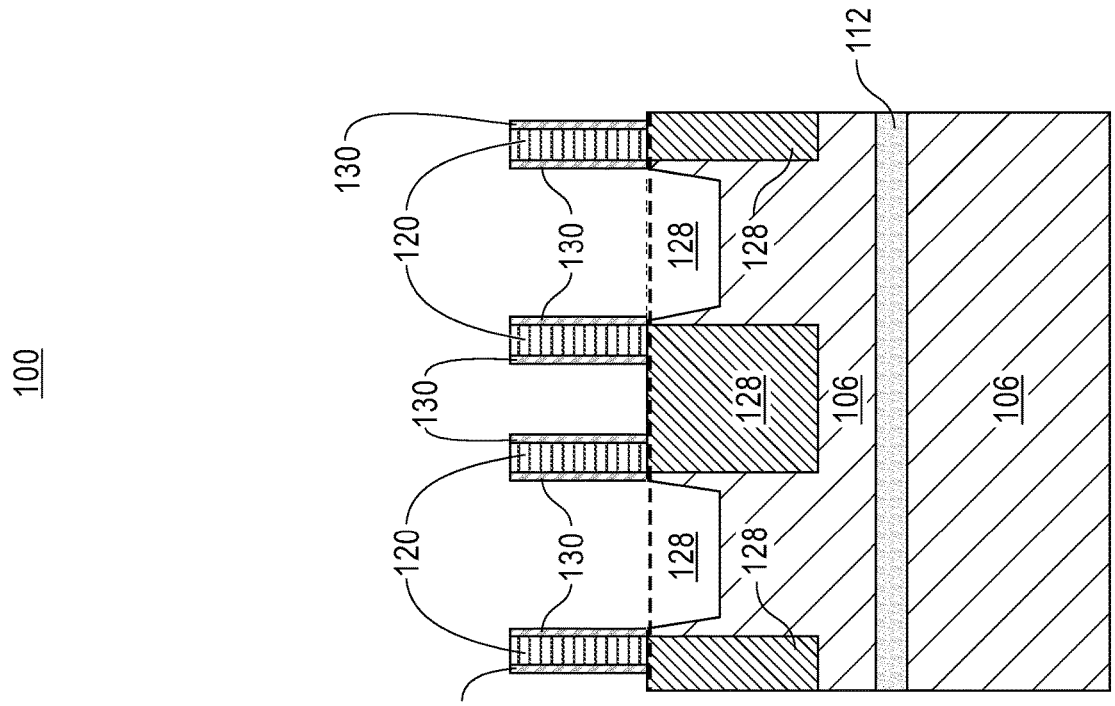
Figure 4B:
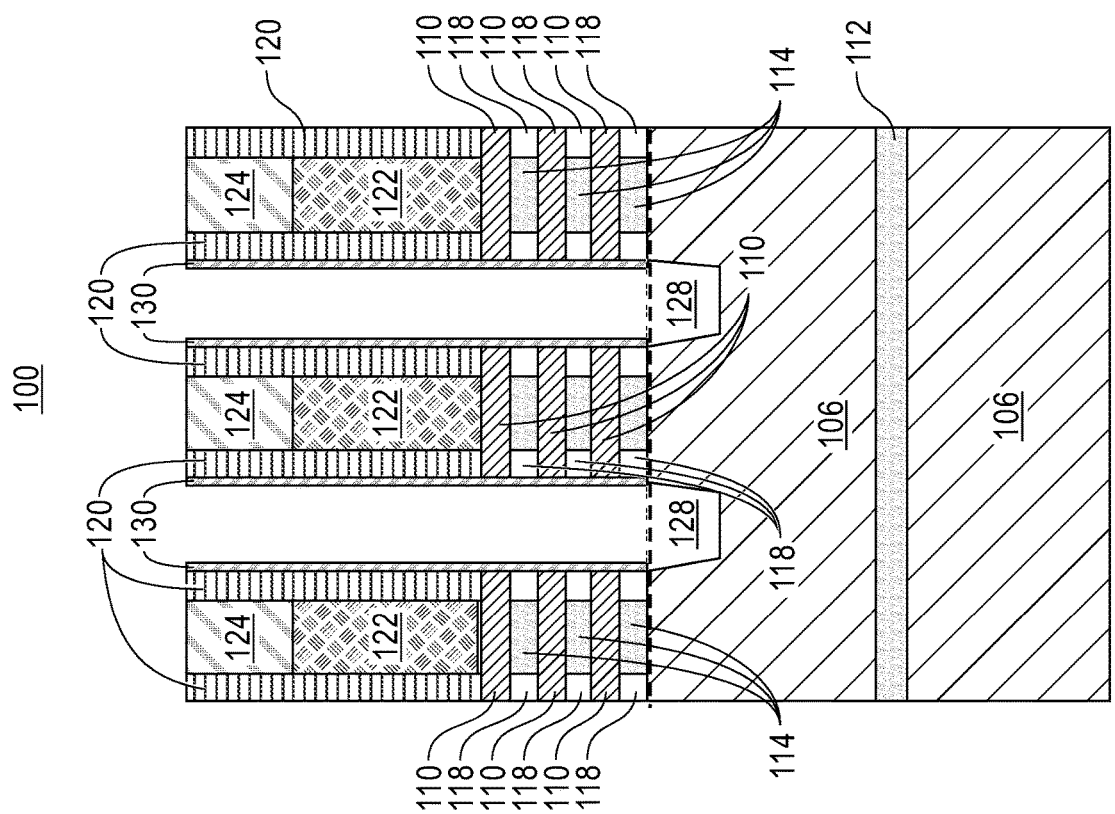

FIGS. 4A-4C depict cross-sectional side views of the semiconductor structure 100 at one stage of fabrication, in accordance with one embodiment of the present invention. The cross-sectional views are indicated in FIG. 1: FIG. 4A is a view along line A-A', FIG. 4B is a view along line B-B', and FIG. 4C is a view along line C-C'. The illustrated stage of the semiconductor structure 100 includes recesses 128 recessed into the substrate 106 between pairs of nanosheet fins. In certain embodiments of the semiconductor structure 100, source/drains (S/Ds) may be grown at this stage, meaning that none of the S/D growth would occur below the BILD plane 116 or below the gate structures. In the illustrated embodiment, on the other hand, the recesses 128 may be recessed using a directional etch process, such as reactive ion etch (RIE), to increase the depth of the eventual S/Ds. Before etching the recesses 128, the semiconductor structure 100 may have protective liners 130 formed over the pre-gate structure (i.e., nanosheet channels 110, dummy layers 114, inner spacers 118, spacers 120, dummy gate 122, and hard mask 124) to protect those components from damage during the etching of the recesses 128. The recesses 128 are etched through the BILD plane 116 such that the recesses 128 are below the nanosheet channels 110 and the gate structure as a whole.

Figure 5A:
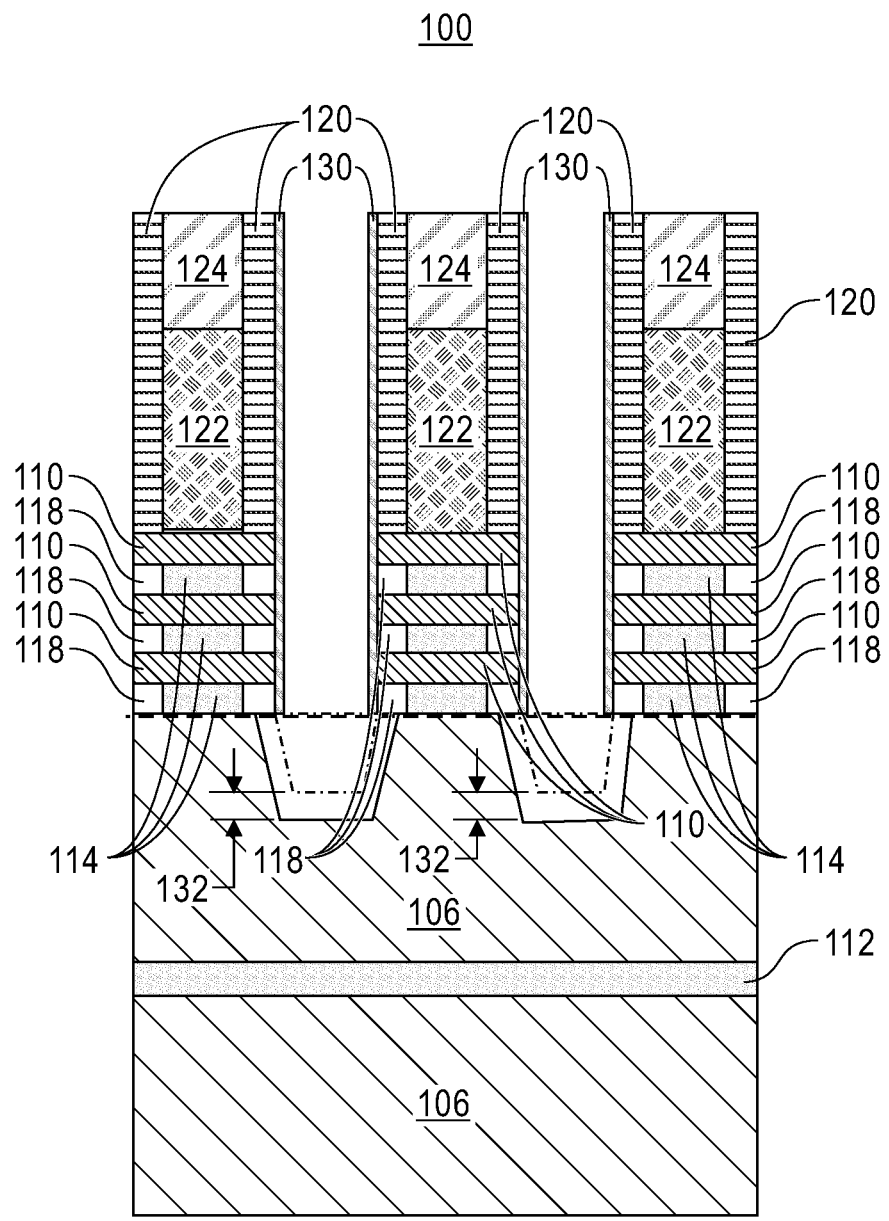
FIGS. 5A-5C depict cross-sectional side views of a semiconductor structure at one stage of fabrication, in accordance with one embodiment of the present invention.
Figure 5C:
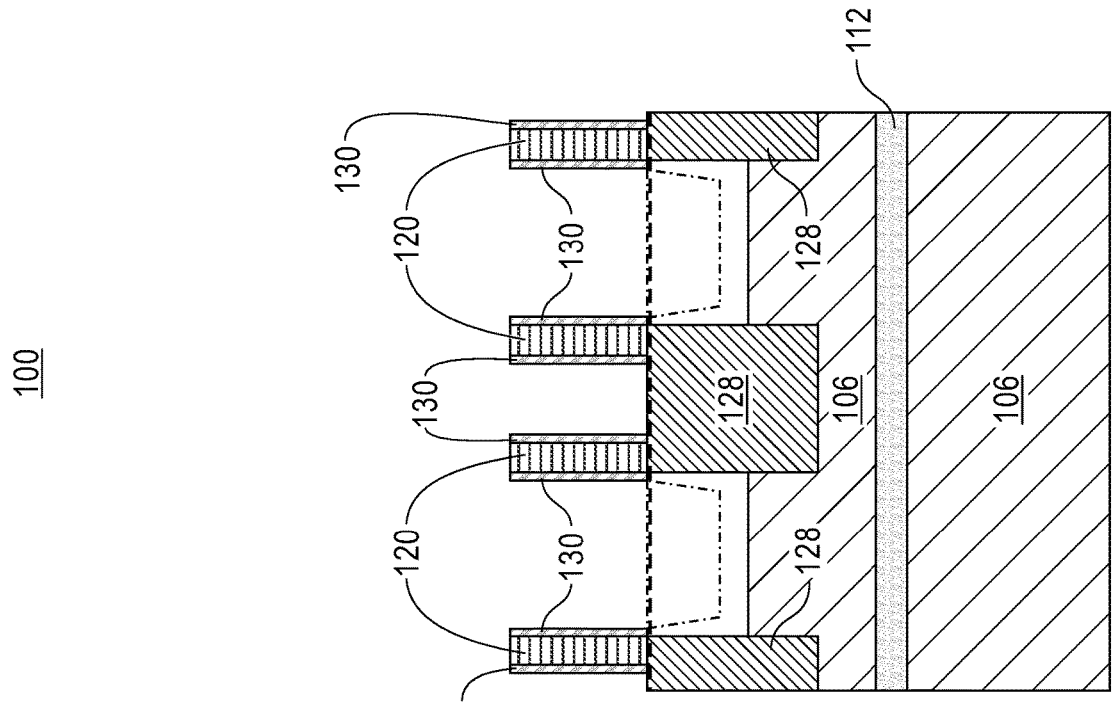
Figure 5B:
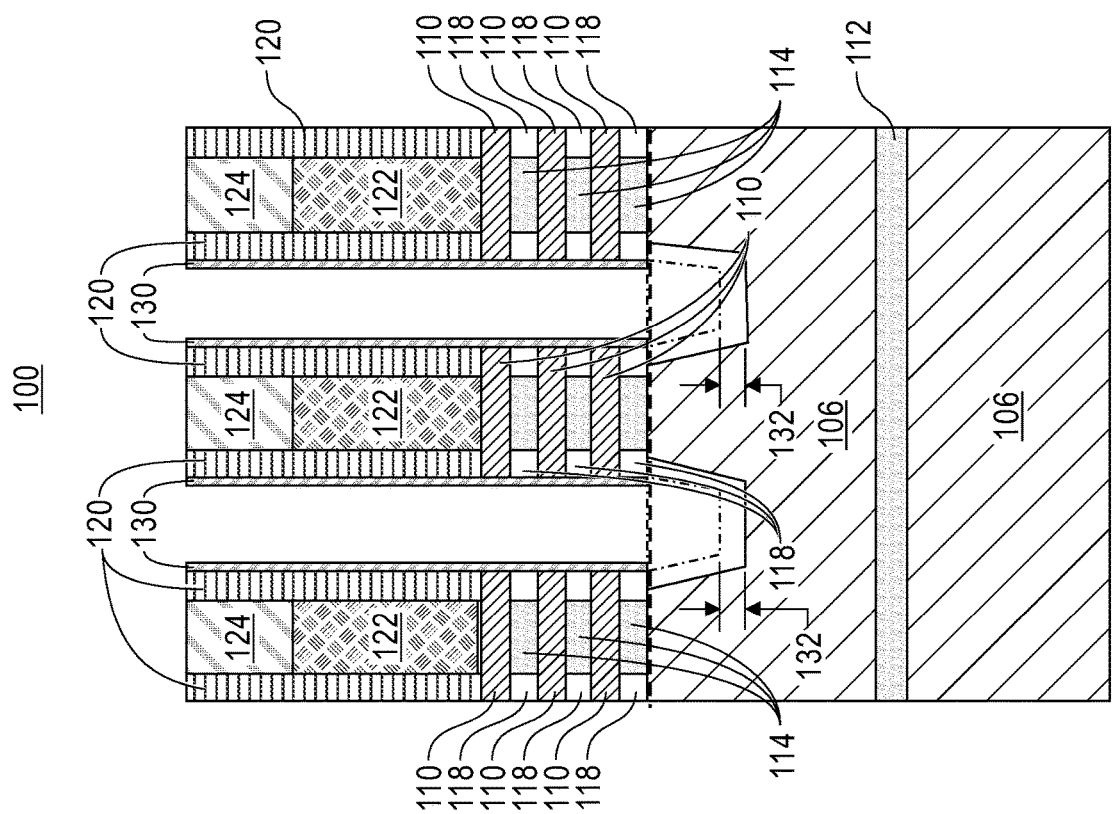

FIGS. 5A-5C depict cross-sectional side views of the semiconductor structure 100 at one stage of fabrication, in accordance with one embodiment of the present invention. The cross-sectional views are indicated in FIG. 1: FIG. 5A is a view along line A-A', FIG. 5B is a view along line B-B', and FIG. 5C is a view along line C-C'. The illustrated stage of the semiconductor structure 100 includes a widening 132 of the recesses 128 in the area below the BILD plane 116. The recesses 128 may be widened using a lateral isotropic etch process that removes material from the surfaces of the recesses 128 equally in all directions, resulting in a loss of material from all exposed surfaces, regardless of the orientation. Portions of the widening 132 of the recesses 128 may extend laterally underneath the inner spacers 118 or the spacers 120.

Figure 6A:
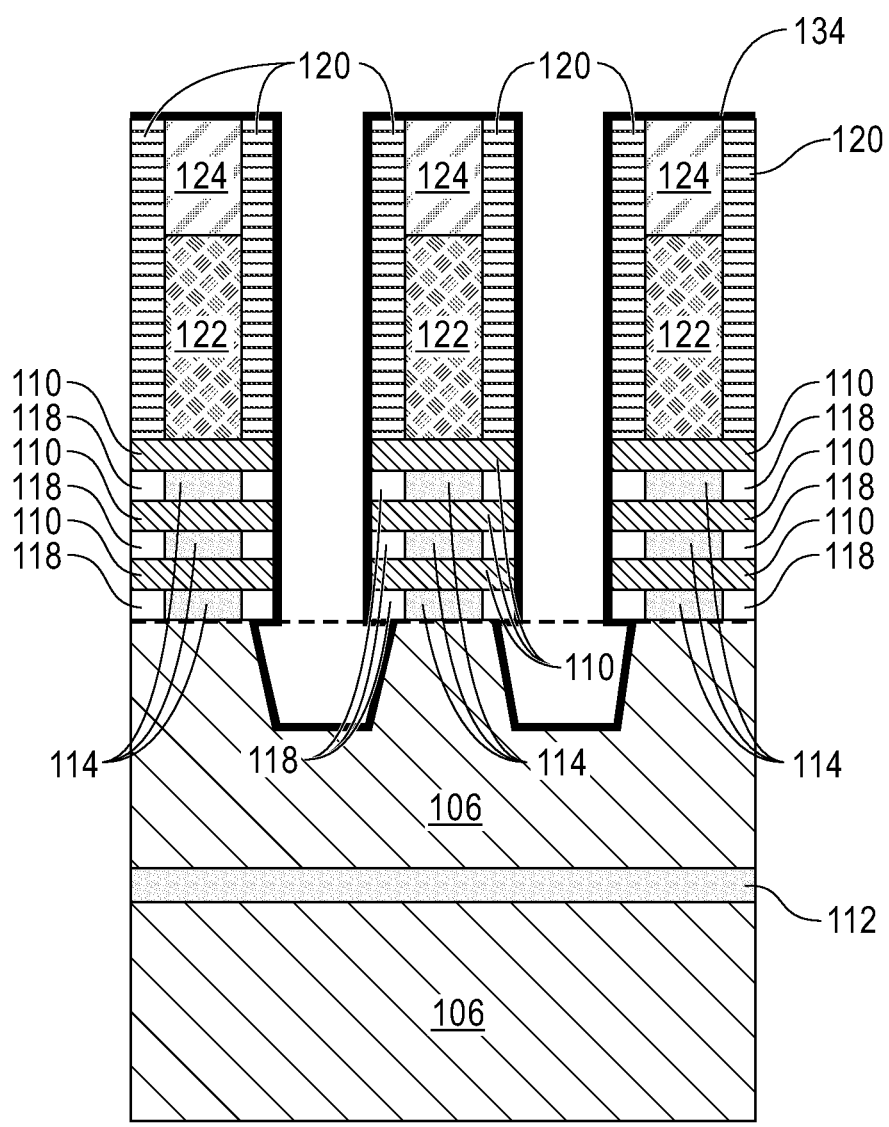
FIGS. 6A-6C depict cross-sectional side views of a semiconductor structure at one stage of fabrication, in accordance with one embodiment of the present invention.
Figure 6B:
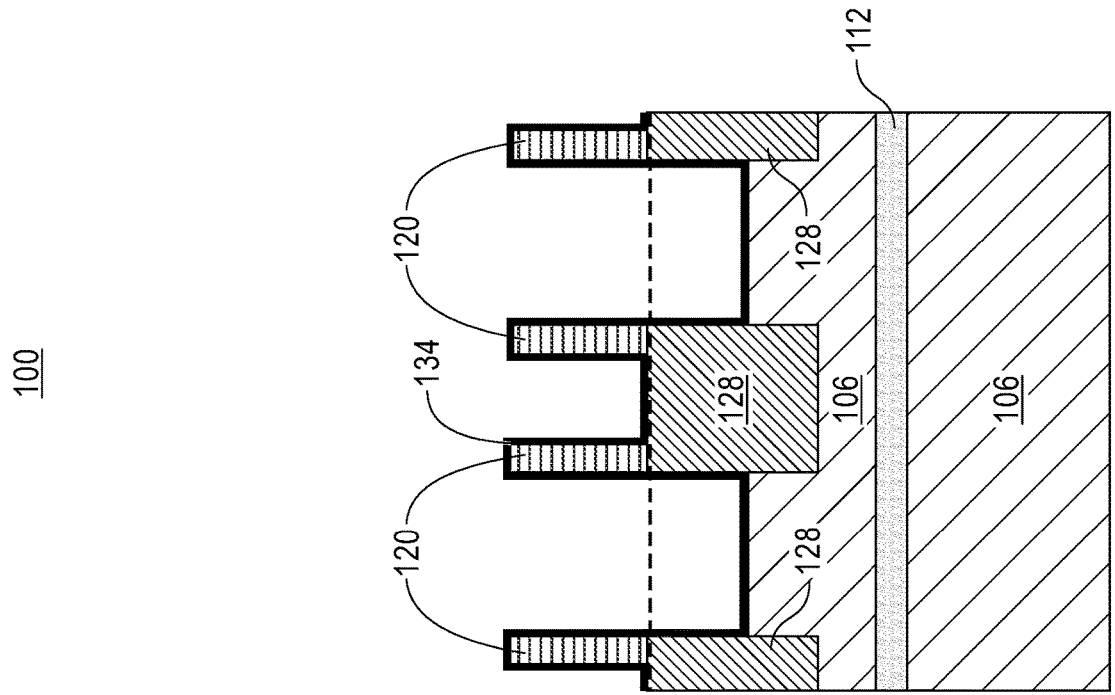
Figure 6C:
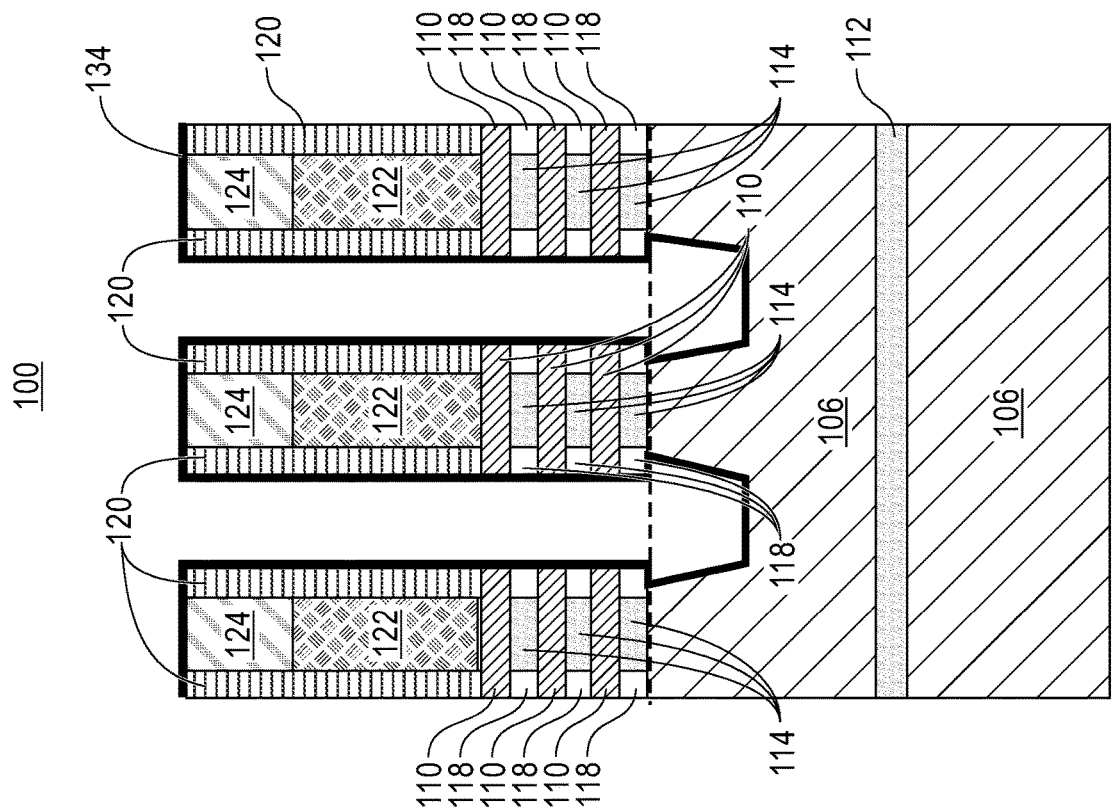

FIGS. 6A-6C depict cross-sectional side views of the semiconductor structure 100 at one stage of fabrication, in accordance with one embodiment of the present invention. The cross-sectional views are indicated in FIG. 1: FIG. 6A is a view along line A-A', FIG. 6B is a view along line B-B', and FIG. 6C is a view along line C-C'. The illustrated stage of the semiconductor structure 100 includes a NFET Si protection nitride (TJ SiN) liner 134 uniformly deposited over the whole surface. The protective liner 130 may be removed before deposition of the TJ SiN liner 134 using a selective etch process such as wet/dry chemical etch. The TJ SiN liner 134 may include a silicon nitride layer, which will be removed from PFET side later, and serves as protection layer for NFET side during PFET S/D epitaxy growth . . .

Figure 7A:
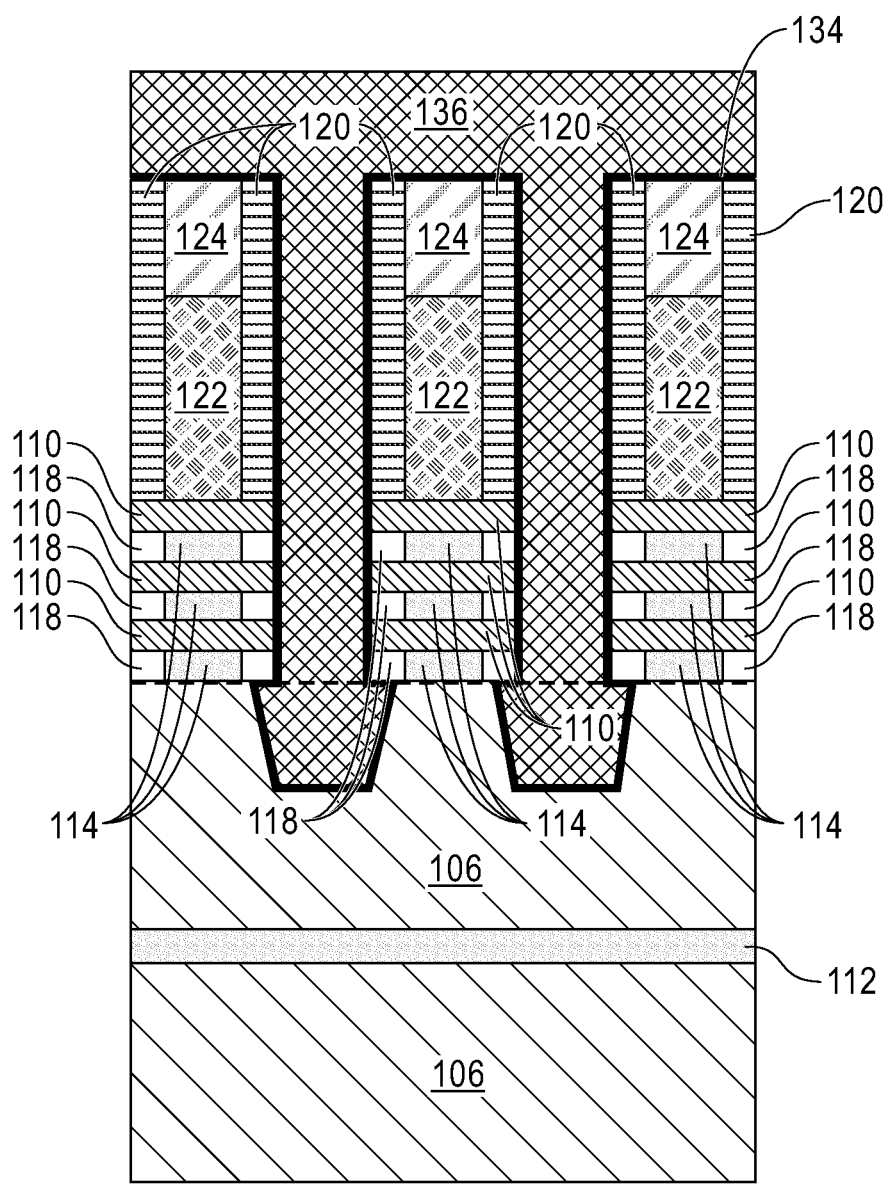
FIGS. 7A-7C depict cross-sectional side views of a semiconductor structure at one stage of fabrication, in accordance with one embodiment of the present invention.
Figure 7C:
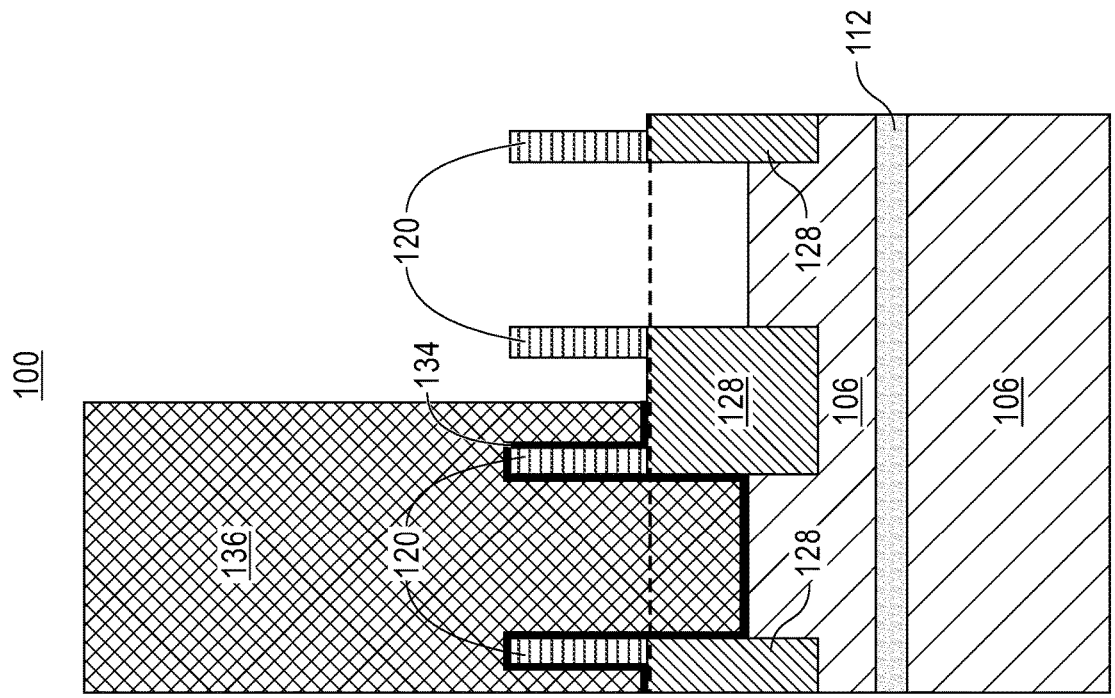
Figure 7B:
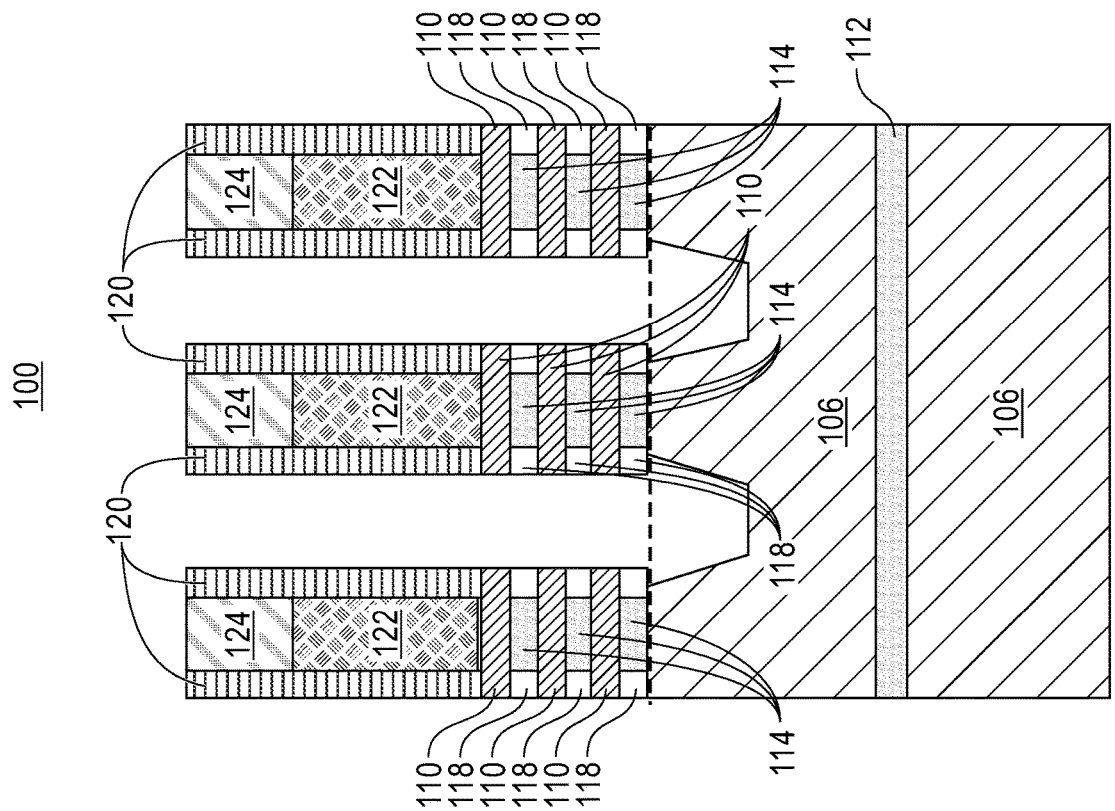

FIGS. 7A-7C depict cross-sectional side views of the semiconductor structure 100 at one stage of fabrication, in accordance with one embodiment of the present invention. The cross-sectional views are indicated in FIG. 1: FIG. 7A is a view along line A-A', FIG. 7B is a view along line B-B', and FIG. 7C is a view along line C-C'. The illustrated stage of the semiconductor structure 100 includes an organic planarization layer (OPL) 136 masking the NFET row 102. The PFET row 104 does not include the OPL 136, and the TJ SiN liner 134 is removed using a selective etch process. The OPL can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL can include a transparent organic polymer. The OPL can be a standard CxHy polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd. The OPL can be applied, for example, by spin-coating.

Figure 8A:
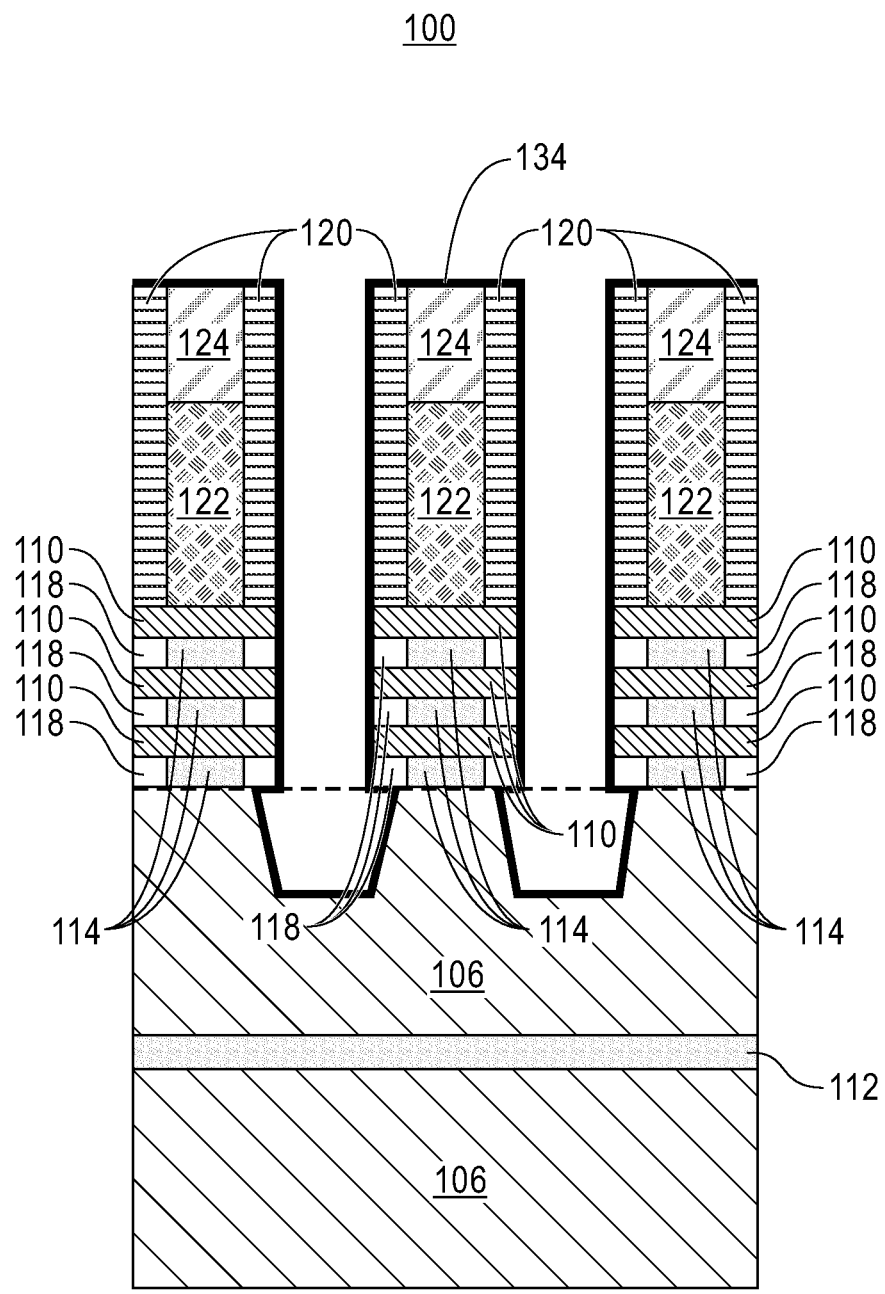
FIGS. 8A-8C depict cross-sectional side views of a semiconductor structure at one stage of fabrication, in accordance with one embodiment of the present invention.
Figure 8C:
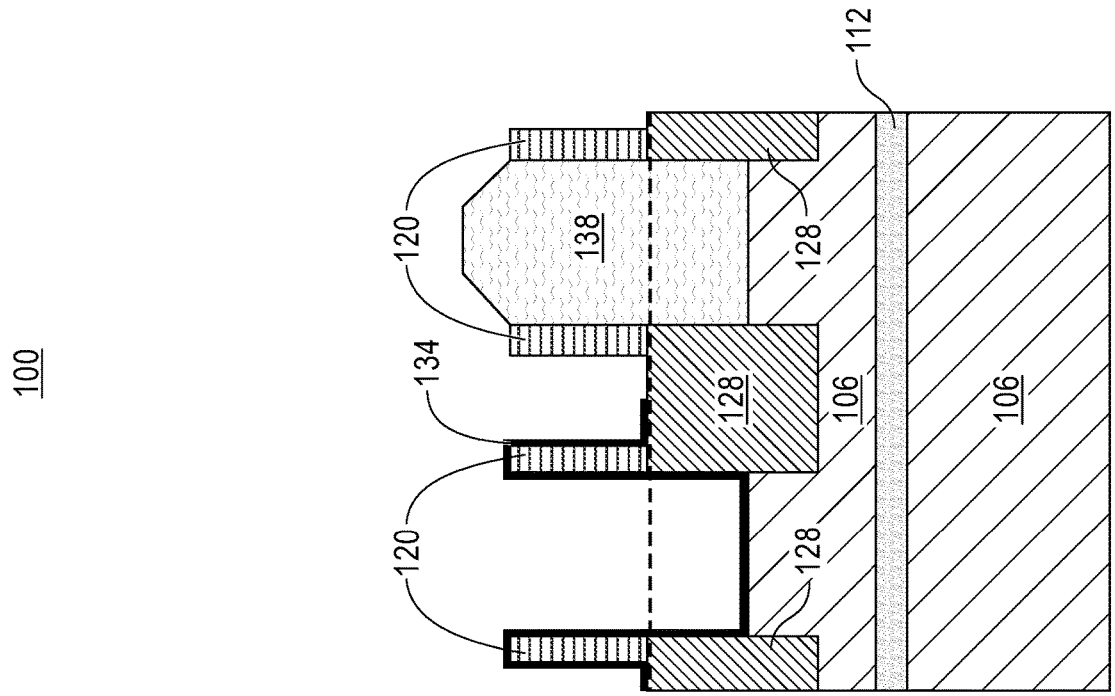
Figure 8B:
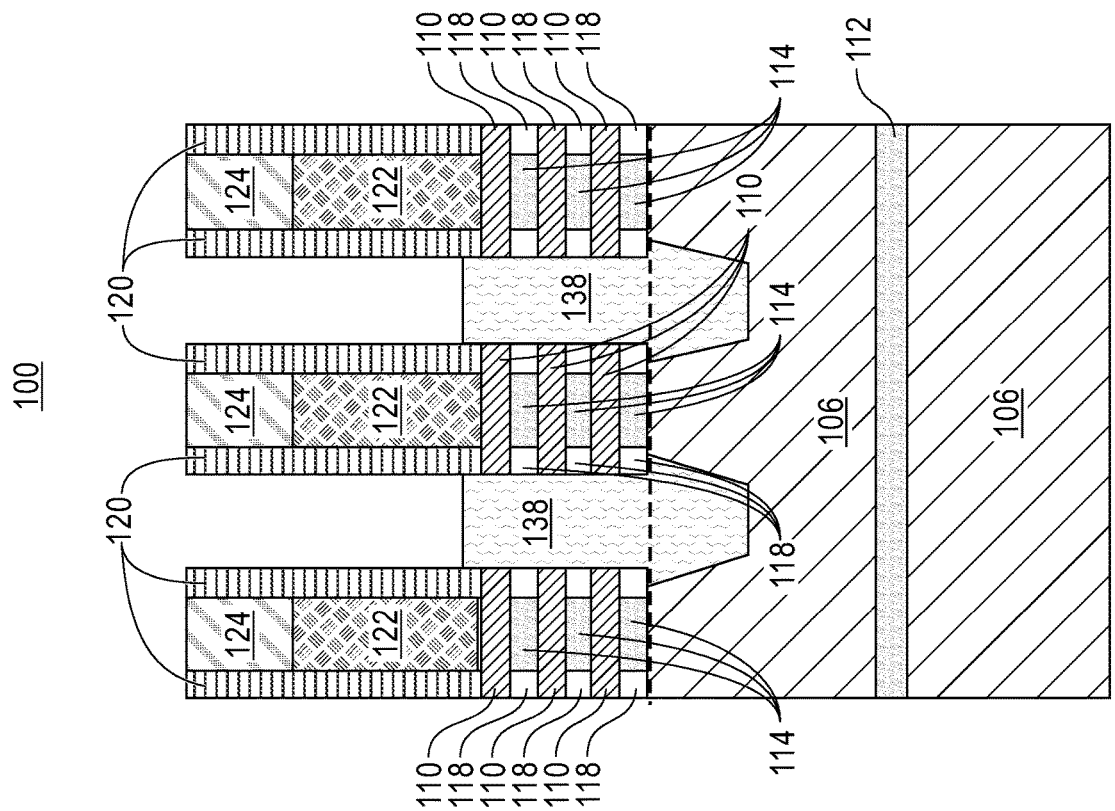

FIGS. 8A-8C depict cross-sectional side views of the semiconductor structure 100 at one stage of fabrication, in accordance with one embodiment of the present invention. The cross-sectional views are indicated in FIG. 1: FIG. 8A is a view along line A-A', FIG. 8B is a view along line B-B', and FIG. 8C is a view along line C-C'. The illustrated stage of the semiconductor structure 100 includes PFET S/Ds 138 between the nanosheet channels 110 within the recesses 128 of the PFET row 104. The PFET S/Ds 138 are epitaxially grown from the seed silicon of the nanosheet channels 110 and the substrate 106. The NFET row 102 (FIG. 8A) does not have any S/Ds grown due to the presence of the TJ SiN liner 130. The spacers 120 and the STI 126 also do not provide a sufficient seed for the epitaxial growth of the PFET S/Ds 138, and therefore the only location for the PFET S/Ds 138 is within the PFET row 104. The PFET S/Ds 138 include a silicon-germanium (SiGe)-based epi that enables an etch process that is selective from the substrate 106 and gives the PFET S/Ds 138 a lower resistance, better PFET contact formation, and better stress benefit, which can improve PFET performance. The OPL 136 is removed in FIG. 8A, and the removal may occur before or after the growth of the PFET S/Ds 138. In-situ doping can be done during PFET S/D epi growth process, such as forming a SiGe:B epi for PFETs.

Figure 9A:
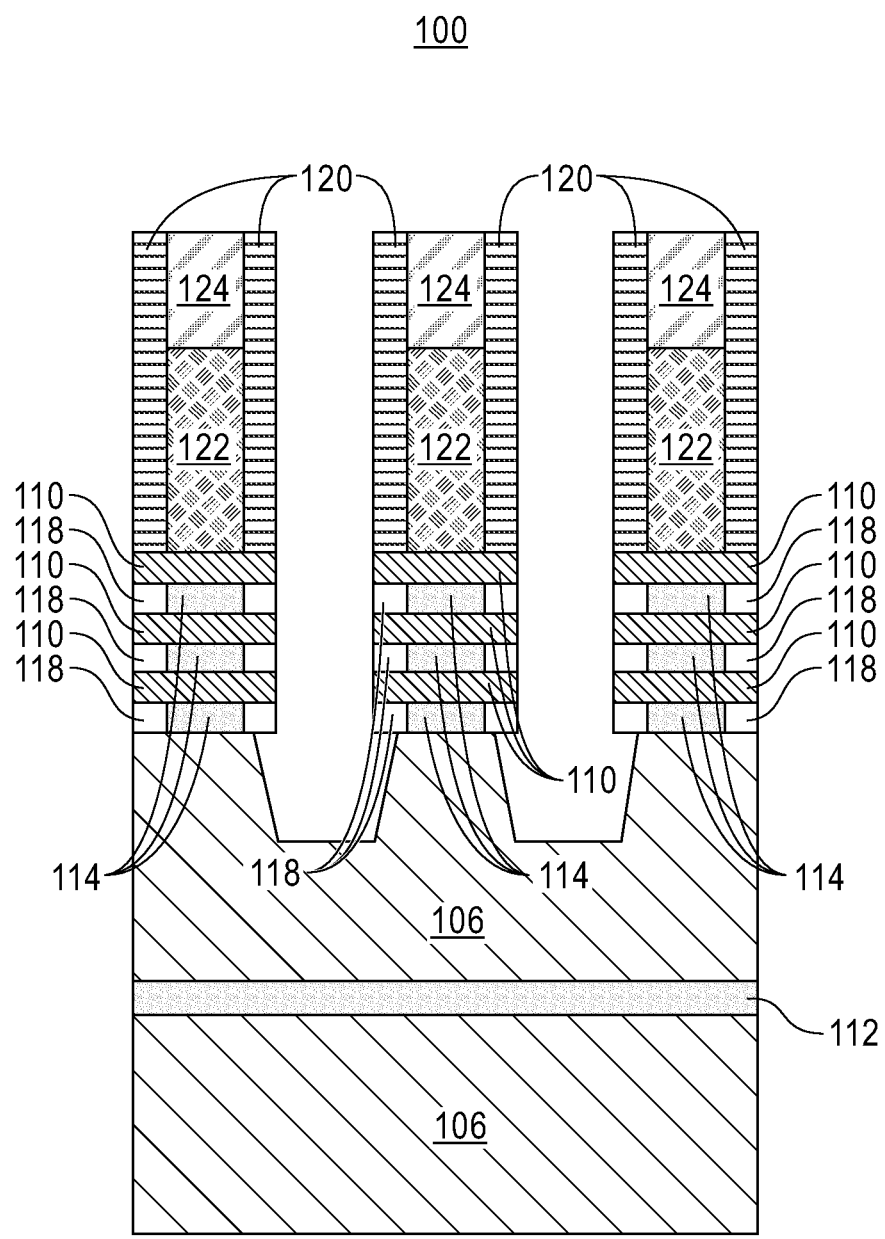
FIGS. 9A-9C depict cross-sectional side views of a semiconductor structure at one stage of fabrication, in accordance with one embodiment of the present invention.
Figure 9C:
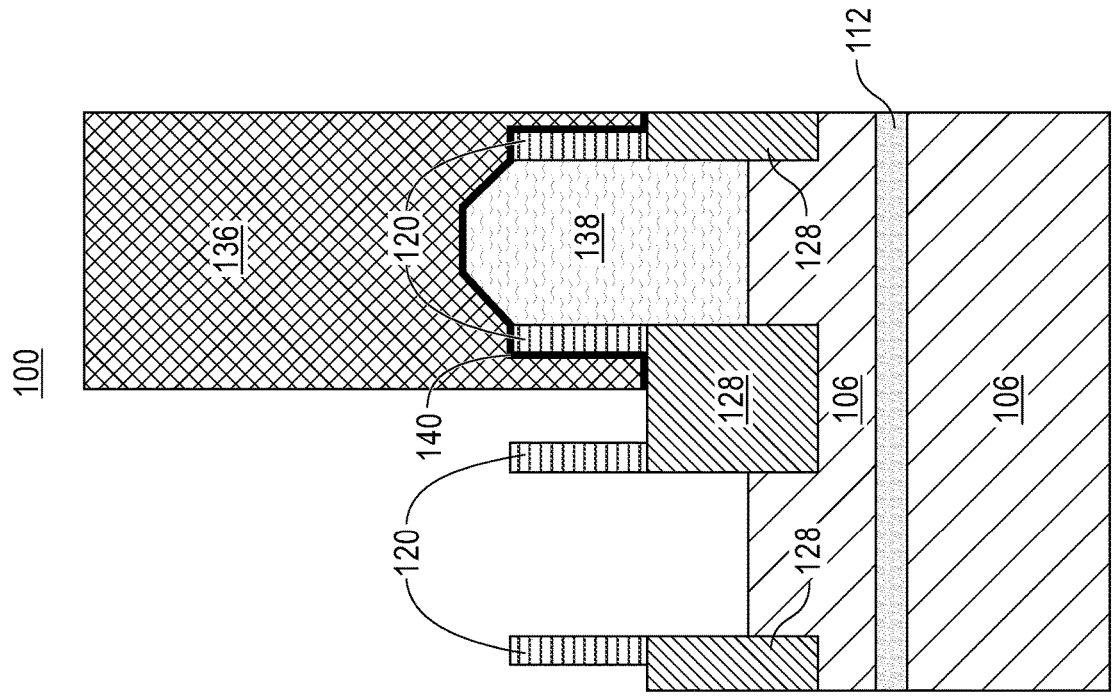
Figure 9B:
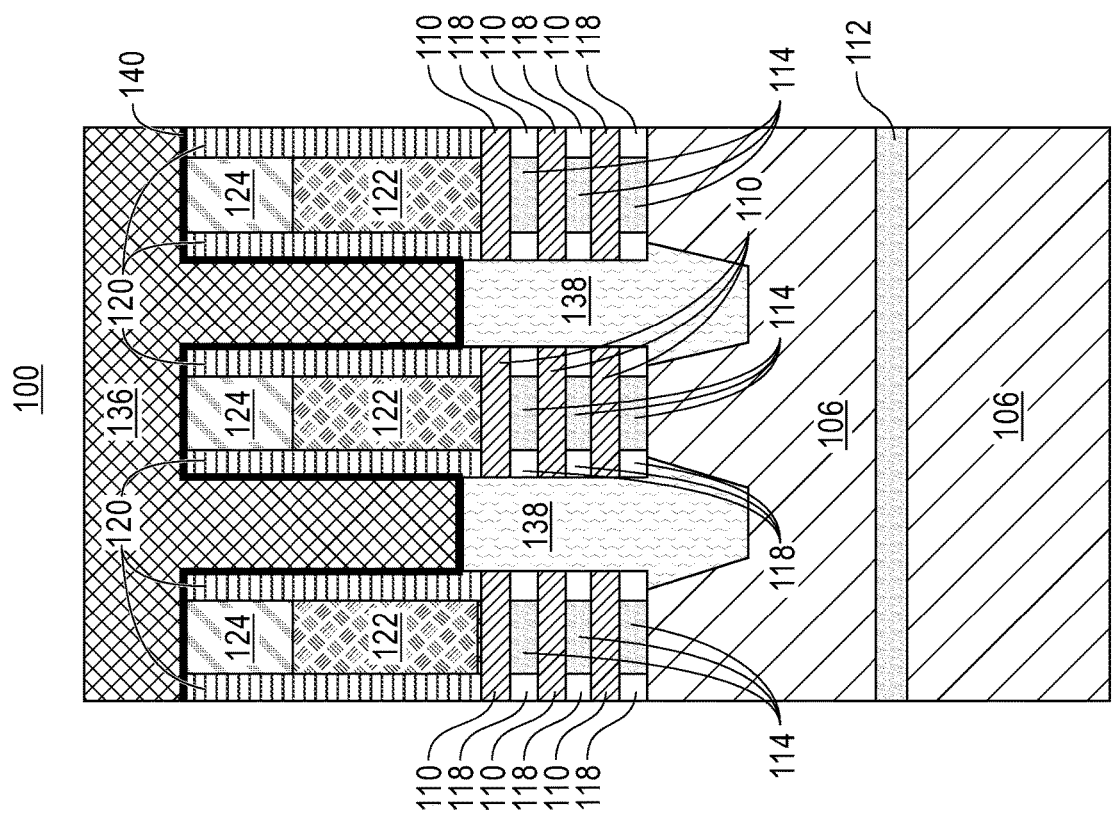

FIGS. 9A-9C depict cross-sectional side views of the semiconductor structure 100 at one stage of fabrication, in accordance with one embodiment of the present invention. The cross-sectional views are indicated in FIG. 1: FIG. 9A is a view along line A-A', FIG. 9B is a view along line B-B', and FIG. 9C is a view along line C-C'. The illustrated stage of the semiconductor structure 100 includes removing TJ liner and depositing a fresh PFET S/D protection nitride liner (RG SiN liner) 140 and another patterning process using OPL 136 blocking the PFET row 104. The RG SiN liner 140 may be deposited similarly to the TJ SiN liner 134, as a blanket layer over the whole semiconductor structure 100. After deposition, the RG SiN liner 140 is patterned, for example using the same patterning used to etch the OPL 136, and then the RG SiN liner 140 is removed from the NFET row 102, which is now clean and ready for epitaxial growth.

Figure 10A:
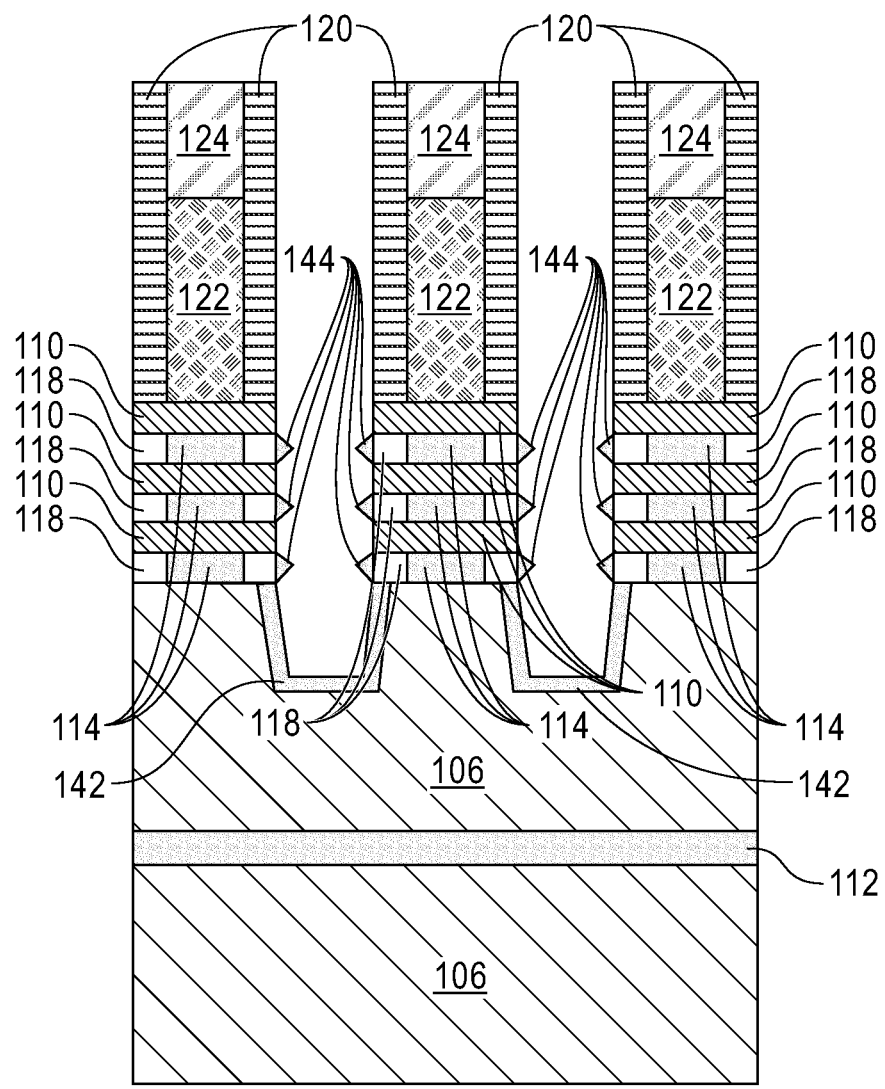
FIGS. 10A-10C depict cross-sectional side views of a semiconductor structure at one stage of fabrication, in accordance with one embodiment of the present invention.
Figure 10B:
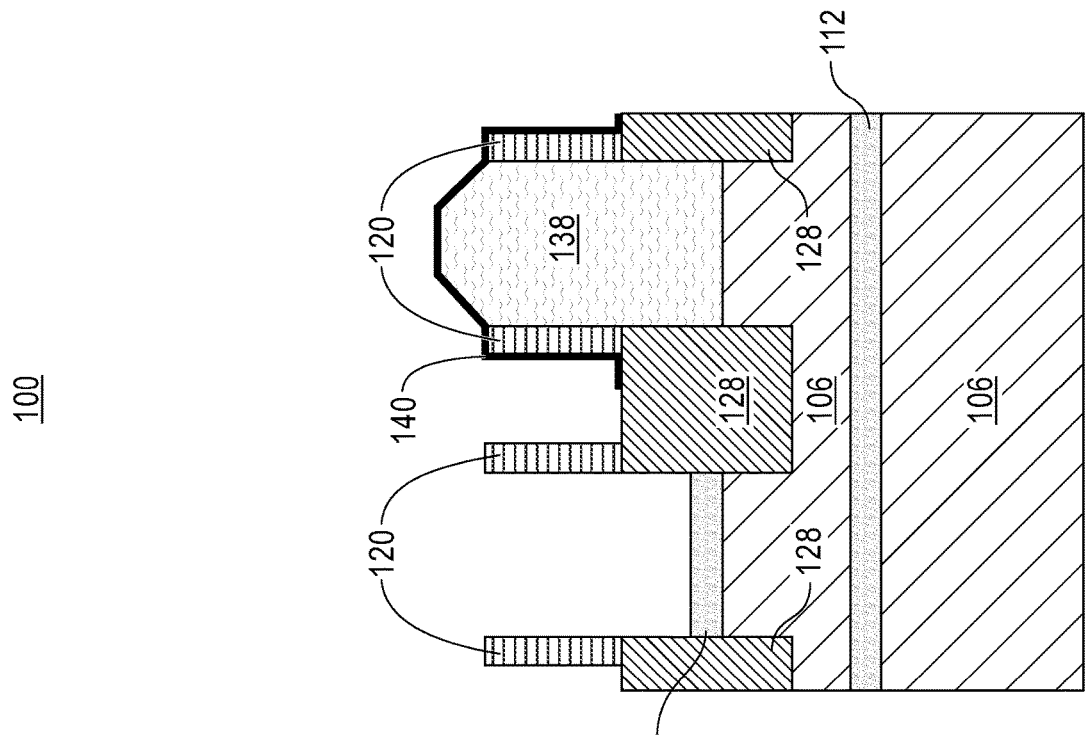
Figure 10C:
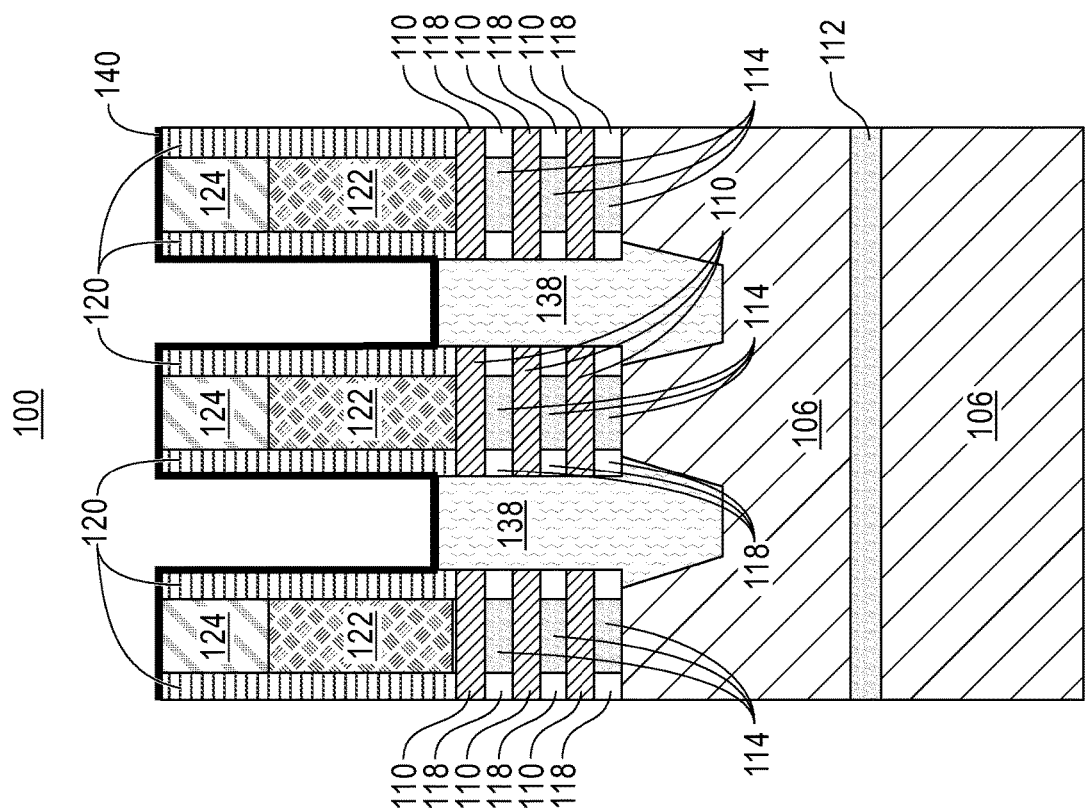

FIGS. 10A-10C depict cross-sectional side views of the semiconductor structure 100 at one stage of fabrication, in accordance with one embodiment of the present invention. The cross-sectional views are indicated in FIG. 1: FIG. 10A is a view along line A-A', FIG. 10B is a view along line B-B', and FIG. 10C is a view along line C-C'. The illustrated stage of the semiconductor structure 100 includes a thin SiGe epitaxy layer (epi) 142 lining the recesses 128 of the substrate 106 below the BILD plane 116. The SiGe epi 142 may include the same concentration of germanium as the PFET S/D 138. A different concentration may also be used. The process of growing the SiGe epi 142 may also be similar to the process used to grow the PFET S/Ds 138. As illustrated, however, the SiGe epi 142 is much thinner than the PFET S/Ds 138, which may be accomplished by shortening the time in which the SiGe epi 142 is grown (compared to the growth time allotted for growing the PFET S/Ds 138). The SiGe growth used to form the SiGe epi 142 may also result in traces (i.e., SiGe epi nucleation) 144 growing on the exposed nanosheet channels 110.

Figure 11A:
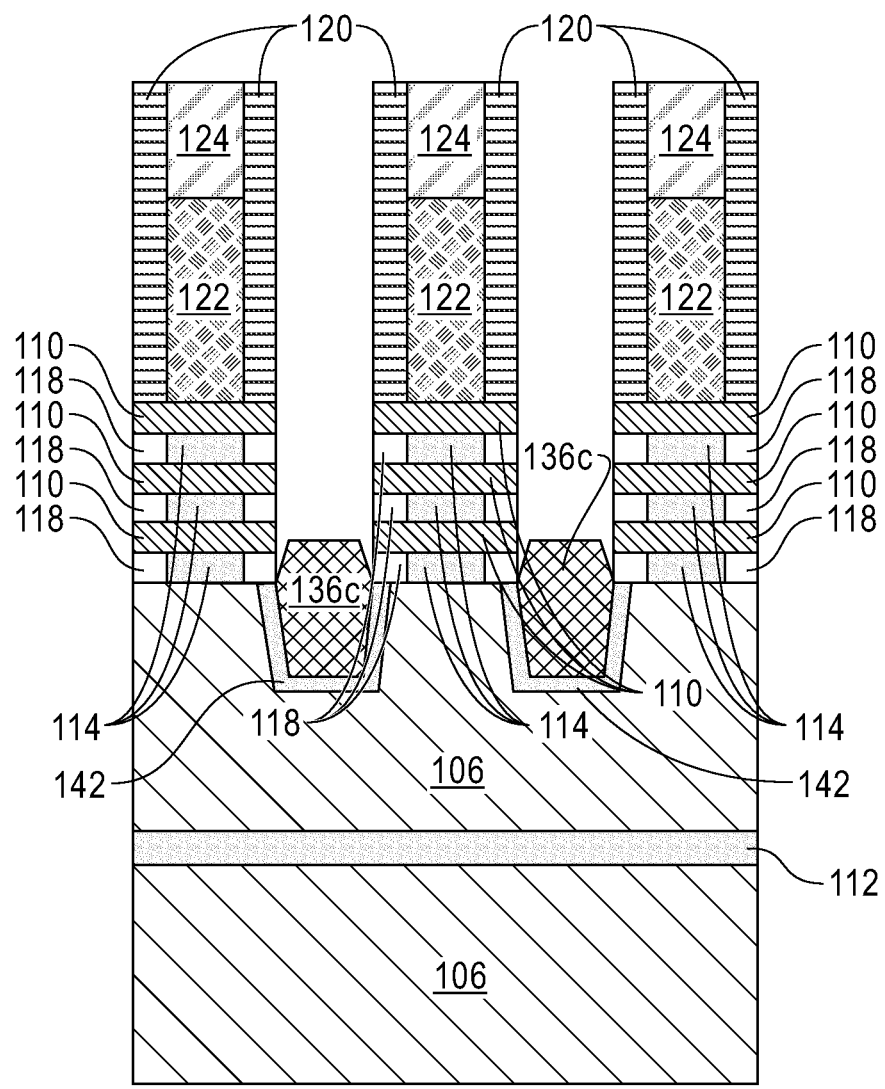

FIGS. 11A-11C depict cross-sectional side views of the semiconductor structure 100 at one stage of fabrication, in accordance with one embodiment of the present invention. The cross-sectional views are indicated in FIG. 1: FIG. 11A is a view along line A-A', FIG. 11B is a view along line B-B', and FIG. 11C is a view along line C-C'. The illustrated stage of the semiconductor structure 100 includes further OPL 136c to facilitate removal of the traces 144. That is, the OPL 136c is deposited and then etched down to a specific level below the traces 144, and then a selective etch process is used to remove the traces 144 without affecting the nanosheet channels 110 or other components of the semiconductor structure 100.

Figure 12A:
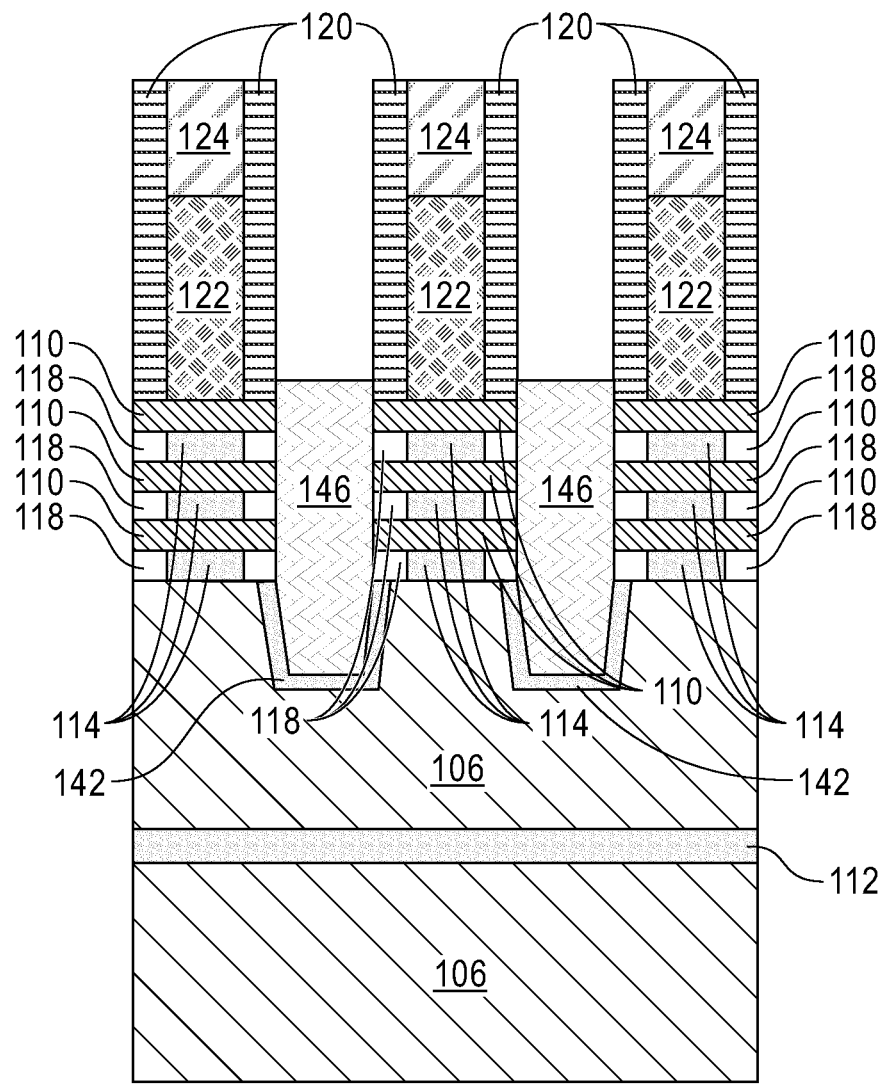
FIGS. 12A-12C depict cross-sectional side views of a semiconductor structure at one stage of fabrication, in accordance with one embodiment of the present invention.
Figures 12B, 12C:
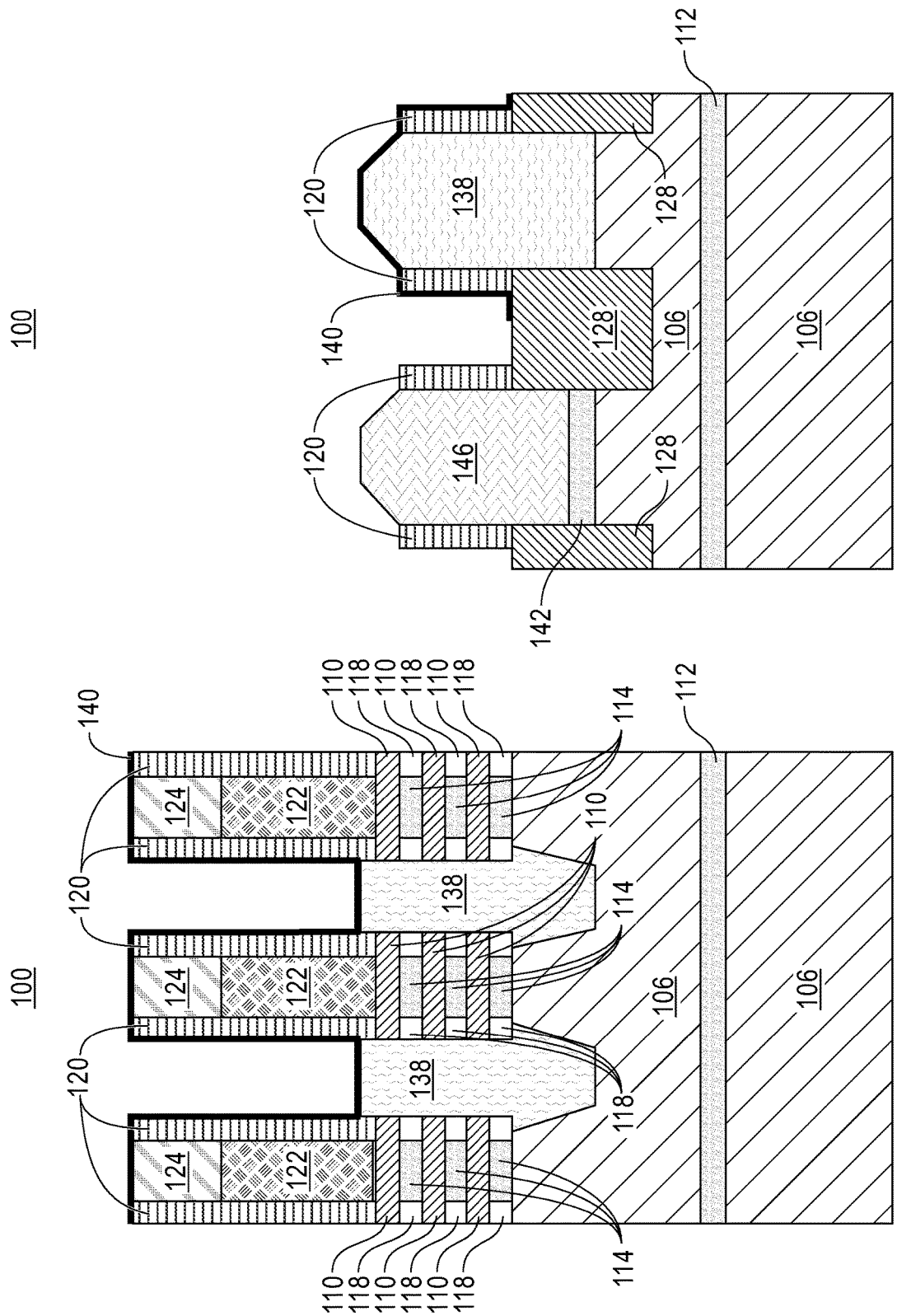

FIGS. 12A-12C depict cross-sectional side views of the semiconductor structure 100 at one stage of fabrication, in accordance with one embodiment of the present invention. The cross-sectional views are indicated in FIG. 1: FIG. 12A is a view along line A-A', FIG. 12B is a view along line B-B', and FIG. 12C is a view along line C-C'. The illustrated stage of the semiconductor structure 100 includes NFET S/Ds 146 formed in the NFET row 102. The NFET S/Ds 146 may be epitaxially grown like the PFET S/Ds 138, but the material of the NFET S/Ds 146 may include silicon (Si)-based epi rather than the SiGe-based epi of the PFET S/Ds 138. The NFET S/Ds 146 (including the SiGe epi 142) protrude (like the PFET S/Ds 138) through the BILD plane 116 between the nanosheet channels 110 and the substrate 106.

Figure 13A:
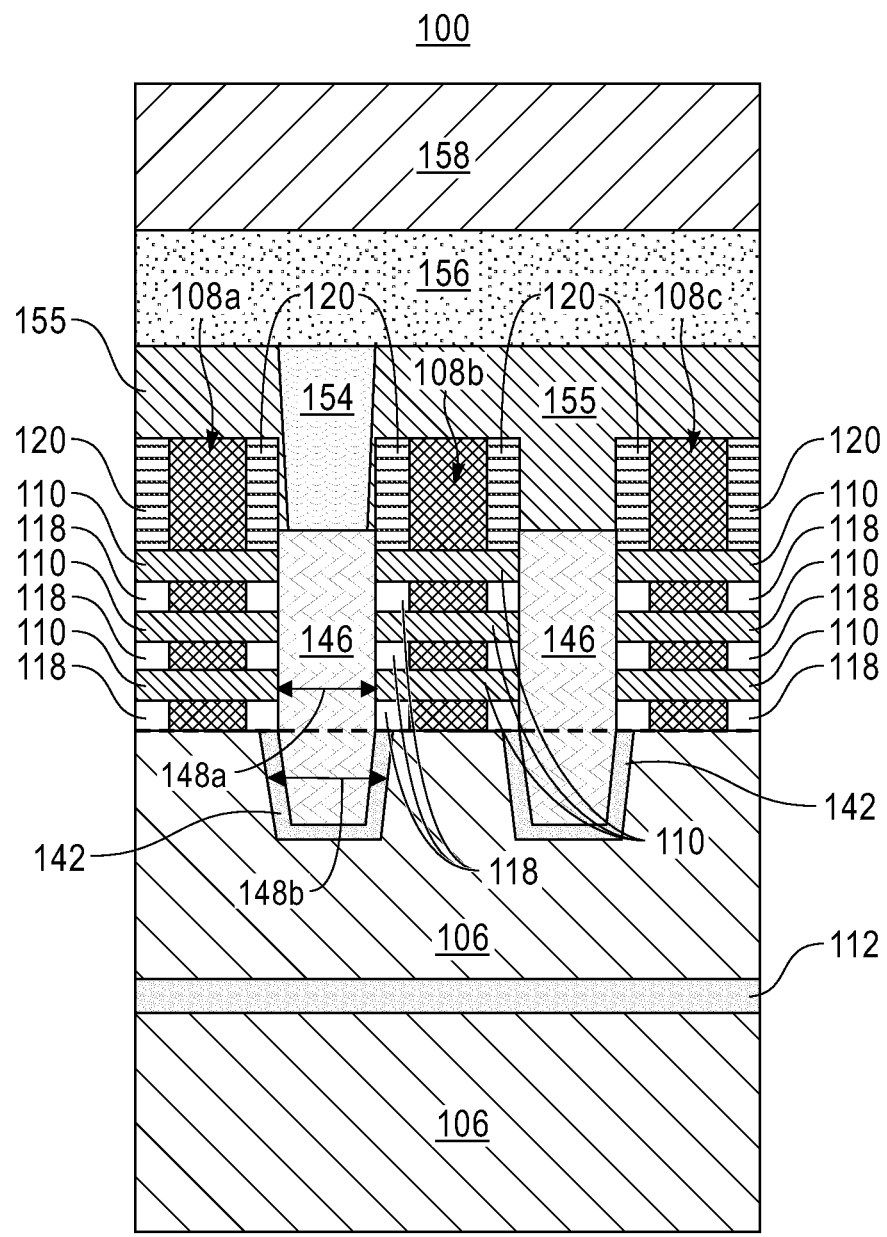
FIGS. 13A-13C depict cross-sectional side views of a semiconductor structure at one stage of fabrication, in accordance with one embodiment of the present invention.
Figure 13C:
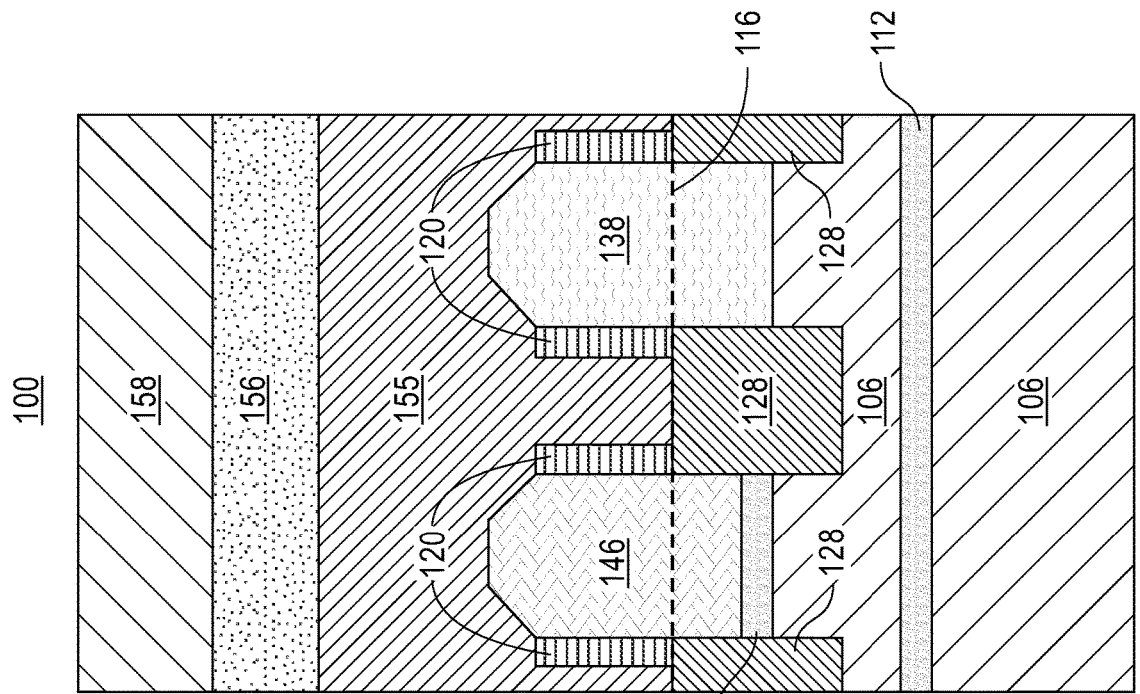
Figure 13B:
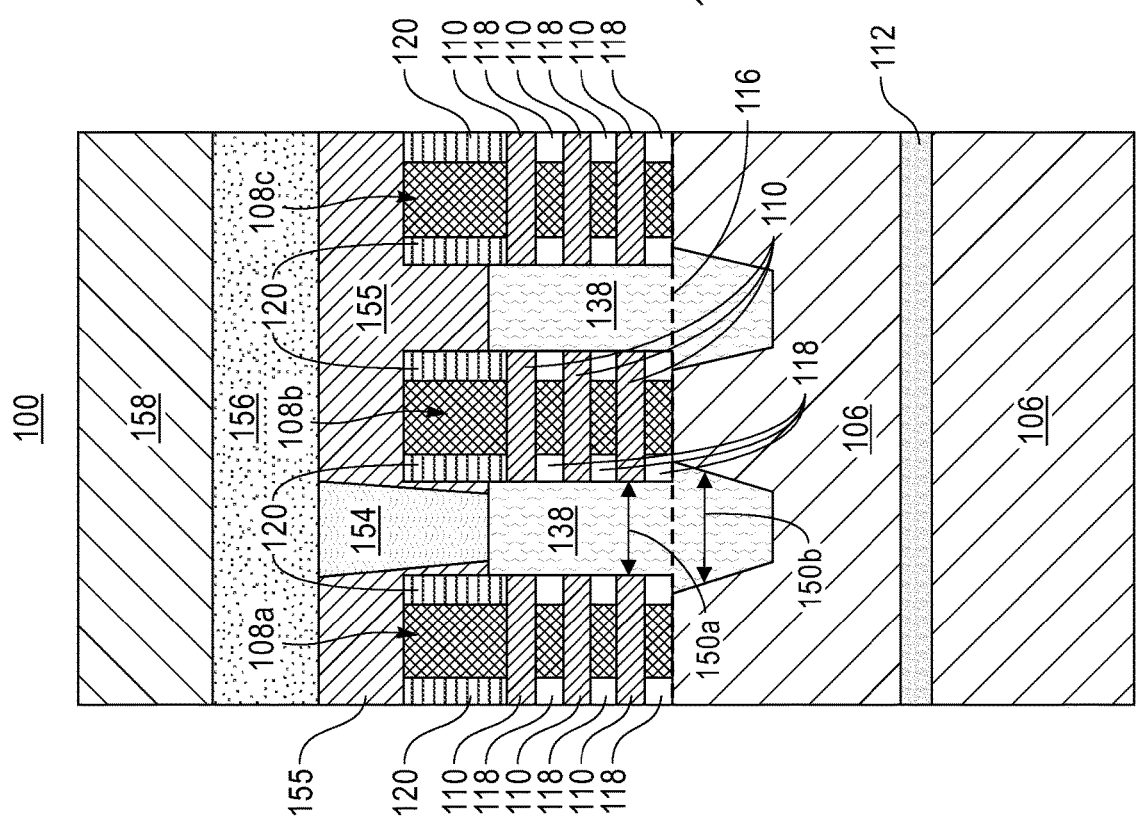

FIGS. 13A-13C depict cross-sectional side views of the semiconductor structure 100 at one stage of fabrication, in accordance with one embodiment of the present invention. The cross-sectional views are indicated in FIG. 1: FIG. 13A is a view along line A-A', FIG. 13B is a view along line B-B', and FIG. 13C is a view along line C-C'. The illustrated stage of the semiconductor structure 100 includes a high-κ metal gate (HKMG) 152 that replaces the dummy layers 114 and the dummy gate 122. The stage also includes a S/D contact 154, an interlayer dielectric (ILD) 155, and a back-end-of-line network (BEOL) 156 that connects the illustrated FETs to the rest of the circuit of the semiconductor structure 100. The BEOL 156 involves the deposition and patterning of metal and dielectric layers on top of the FET devices. The metal interconnects formed within the BEOL 156 provide the electrical connections between the individual FET devices, allowing them to function together as a complete integrated circuit. The BEOL 156 can determine the performance, power consumption, and reliability of the semiconductor structure 100. The semiconductor structure 100 may also include a carrier wafer 158 that enables the semiconductor structure 100 to be flipped, and processes to be completed on the backside of the wafer.

The PFET S/Ds 138 and the NFET S/Ds 146 thus include different critical dimensions (CD) at various depths within the respective rows 102, 104. The CD, as used herein, refers to the smallest feature size or dimension for a component of the semiconductor structure 100 to be able to function properly. In the illustrated embodiment, the NFET S/Ds 146 include a first CD 148a between a first gate 108a and a second gate 108b (and the same for the NFET S/Ds between the second gate 108b and a third gate 108), and a second CD 148b for the portion of the NFET S/Ds below the BILD plane 116. The first CD 148a may be smaller than the second CD 148b since the recesses 128 are widened after the initial recession into the substrate 106.

Figure 14A:
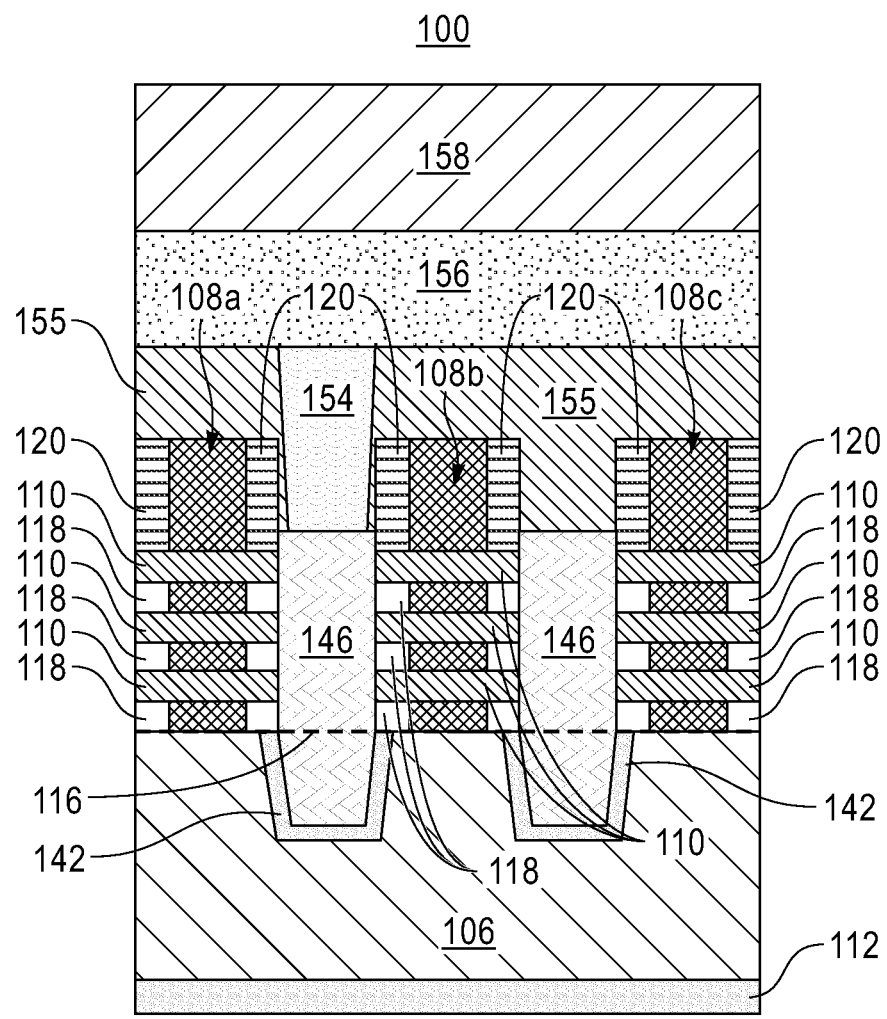
FIGS. 14A-14C depict cross-sectional side views of a semiconductor structure at one stage of fabrication, in accordance with one embodiment of the present invention.
Figure 14C:
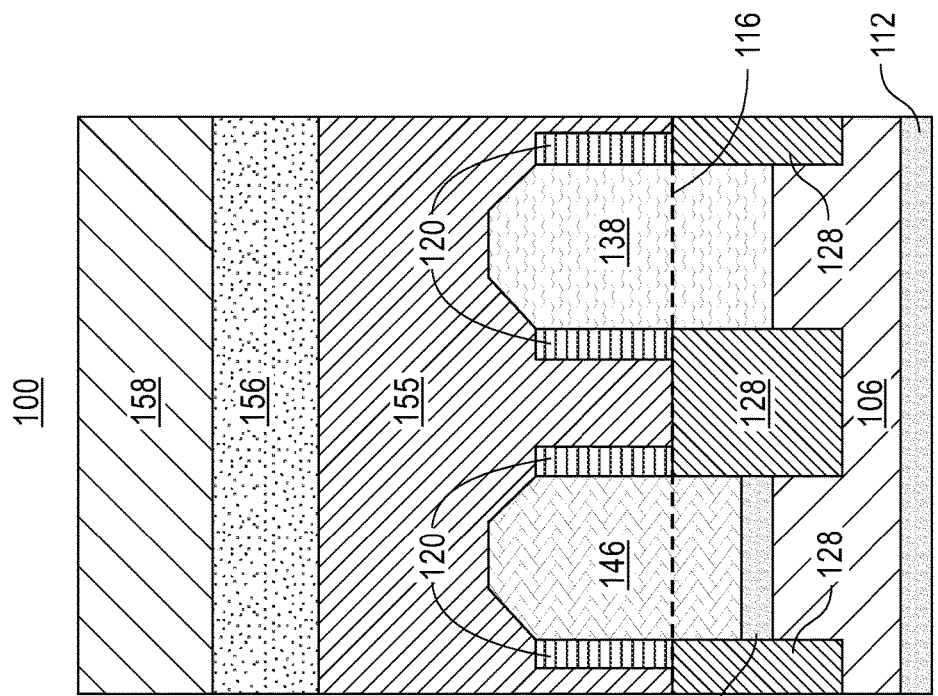
Figure 14B:
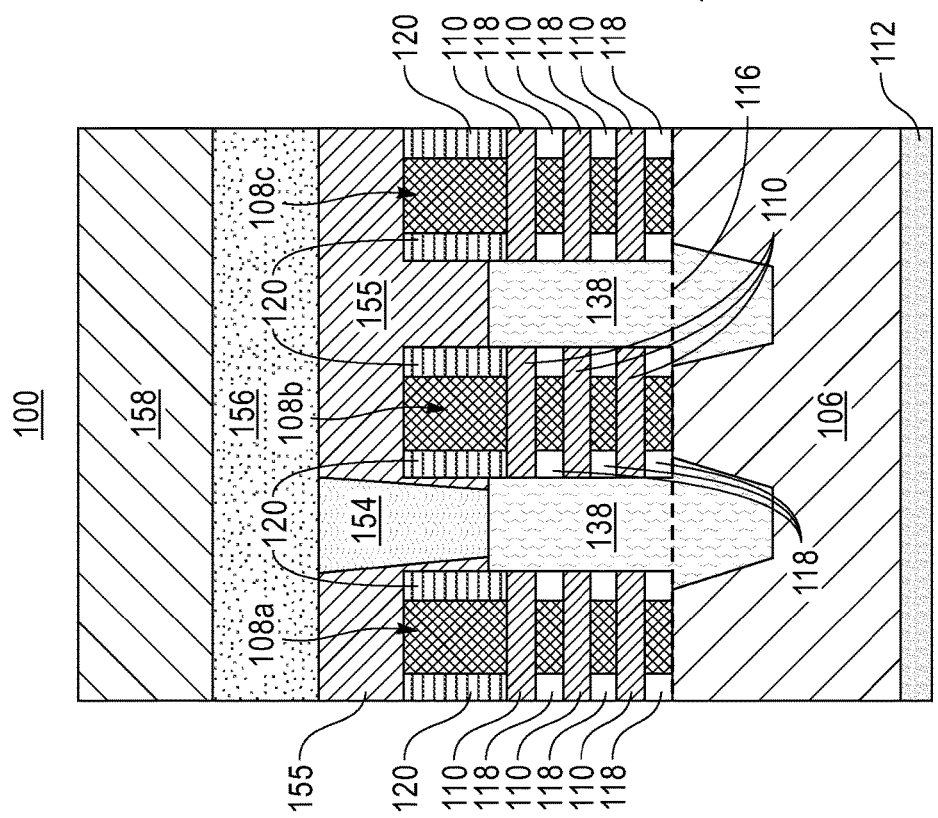

FIGS. 14A-14C depict cross-sectional side views of the semiconductor structure 100 at one stage of fabrication, in accordance with one embodiment of the present invention. The cross-sectional views are indicated in FIG. 1: FIG. 14A is a view along line A-A', FIG. 14B is a view along line B-B', and FIG. 14C is a view along line C-C'. The illustrated stage of the semiconductor structure 100 shows the removal of the substrate 106 up to the etch-stop layer 112. The removal of the substrate 106 may be done after the semiconductor structure 100 is flipped and supported upside-down relative to the orientation shown. That is, the semiconductor structure 100 is supported with the carrier wafer 158 on the bottom.

Figure 15A:
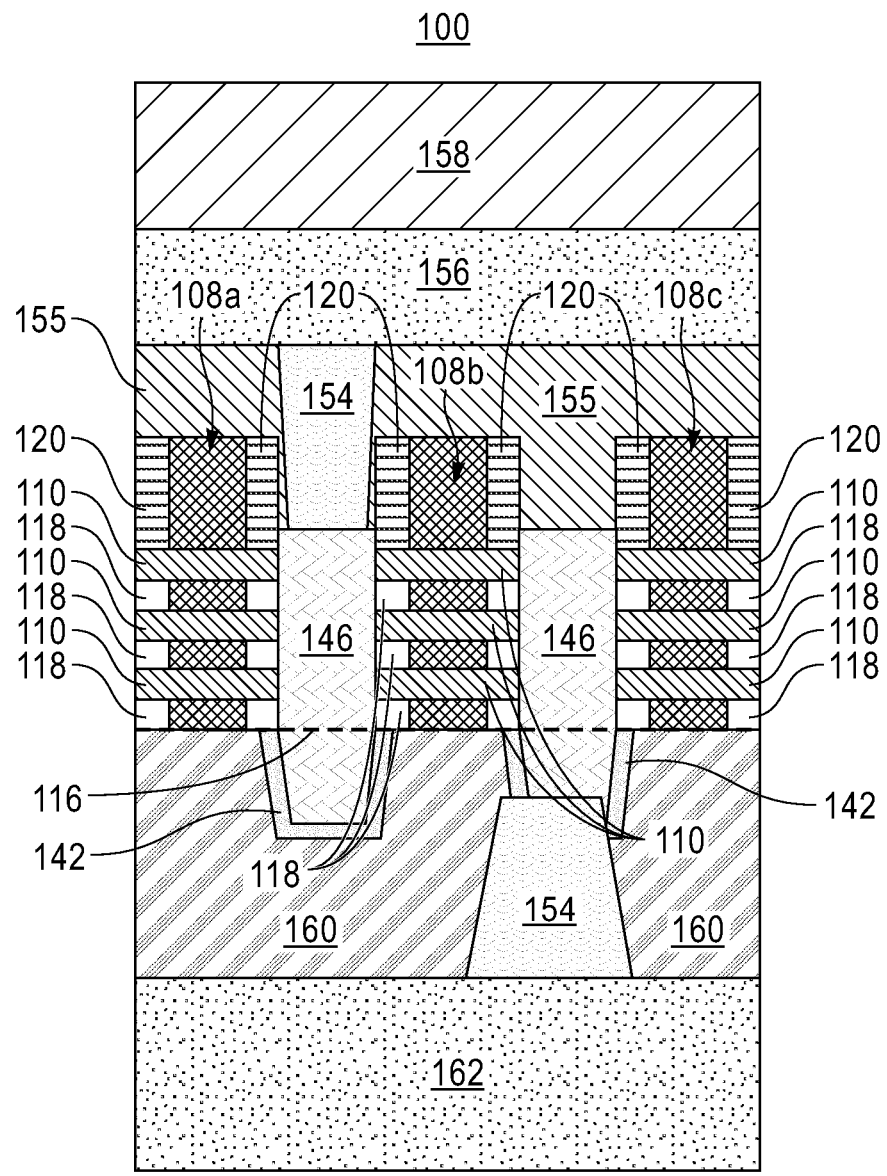
FIGS. 15A-15C depict cross-sectional side views of a semiconductor structure at one stage of fabrication, in accordance with one embodiment of the present invention.
Figure 15C:
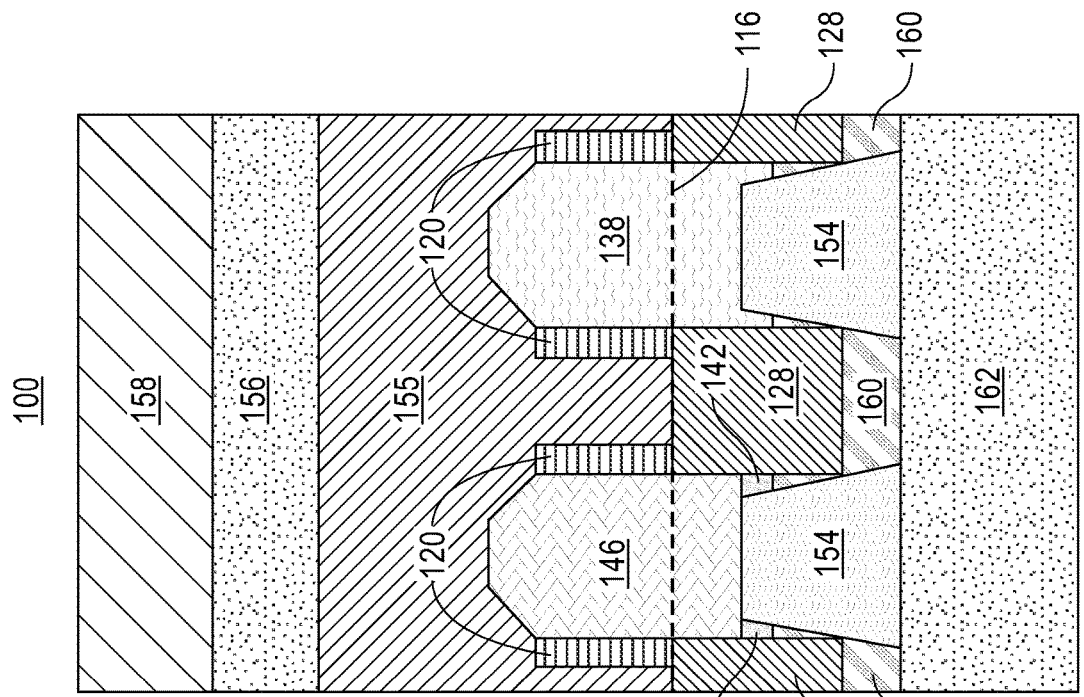
Figure 15B:
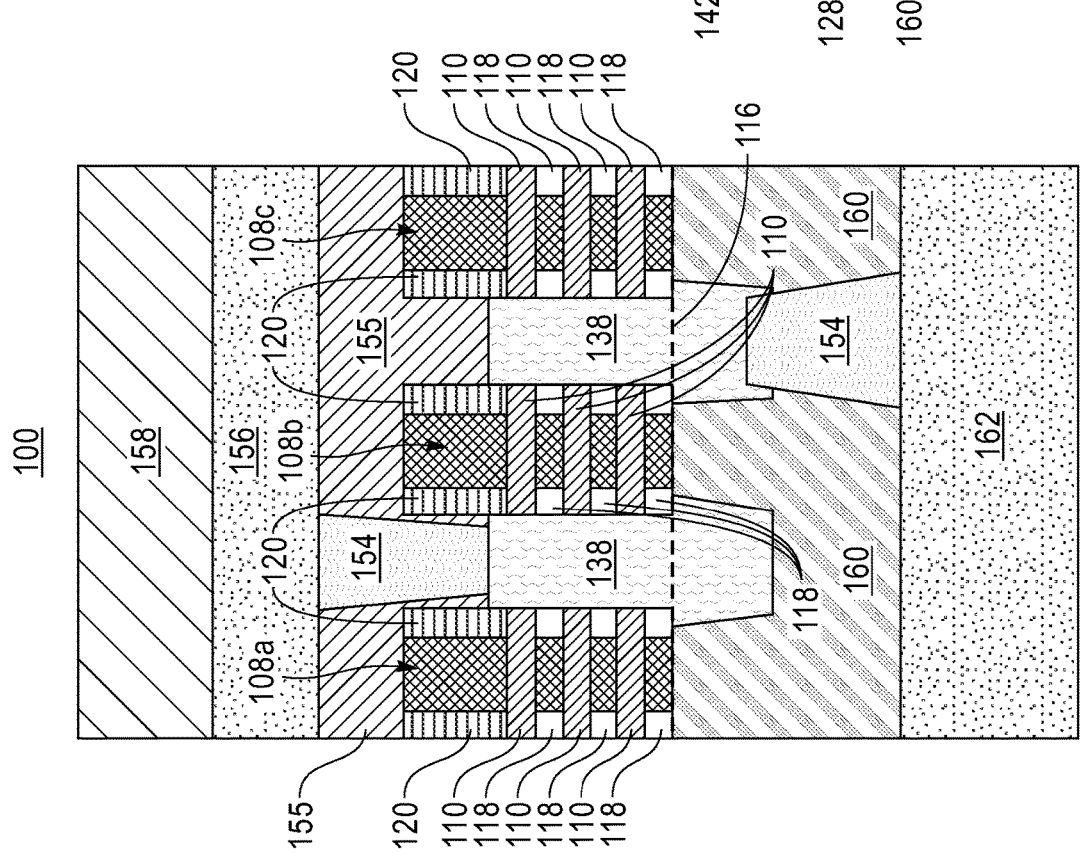

FIGS. 15A-15C depict cross-sectional side views of the semiconductor structure 100 at one stage of fabrication, in accordance with one embodiment of the present invention. The cross-sectional views are indicated in FIG. 1: FIG. 15A is a view along line A-A', FIG. 15B is a view along line B-B', and FIG. 15C is a view along line C-C'. The illustrated stage of the semiconductor structure 100 includes a backside interlayer dielectric (BILD) 160, and a backside power delivery network (BSPDN) 162 that distributes power and ground signals to the S/Ds 138, 146 on the front side of the semiconductor structure 100.

The BILD 160 is formed after the substrate 106 is removed using a selective etch process such as a wet or dry chemical wash. The Si-based substrate 106 may be removed without affecting the STI 126, HKMG 152, inner spacers 118, or the PFET S/Ds 138. The SiGe epi 142 wraps around the Si-based epi and fully insulates the NFET S/D 146 from the BILD 160 to protect the Si-based NFET S/Ds 146, which would otherwise be susceptible to damage during the selective etch process. The BILD 160 may be formed from materials chosen to provide high electrical insulation and low parasitic capacitance, while also being compatible with the underlying semiconductor and metal layers. For example, the BILD 160 may include silicon dioxide (SiO2), silicon nitride (SiN), organic polymers, or spin-on glass (SOG).

The power and ground interconnects of the BSPDN 162 enable the lower levels of the frontside interconnect 156 to be used exclusively for the signal routing and delivering the control signals to the FETs. The BSPDN 162 may include metal power and ground wires, as well as metal interconnects and vias that connect the wires to the S/Ds 138, 146. The BSPDN 162 is electrically connected to the FETs through a backside contact (BSCA) 164, that is formed by etching a hole through the BILD 160 to the corresponding PFET S/D 138 or NFET S/D 146, and then metalizing the hole. The BSPDN 162 is typically formed after the metalizing of the BSCA 164.

In operation, the BEOL 156 conveys a signal through a gate contact (not shown) to the HKMG 152. The HKMG 152 controls whether the nanosheet channels 110 enable or restrict the signal flow between the PFET S/Ds 138 or the NFET S/Ds 146. When the HKMG 152 is enabled, signal flows through the S/D contact 154, one S/D 138, 146, the nanosheet channels 110, the second S/D 138, 146, and the BSCA 164. The BSCA 164 is offset from the HKMG 152 due to the S/Ds 138, 146 protruding into the BILD 160, which reduces the likelihood that a signal will short from the BSCA 164 to the HKMG 152, even in a situation where the BSCA 164 is misaligned with the S/D. An example of misalignment is shown in FIG. 15A, where the BSCA 164 is slightly left of center in matching with the NFET S/D 146. Even in this example, however, the distance between the BSCA 164 and the HKMG 152 is sufficient enough that no shorting will occur.

Figure 16A:
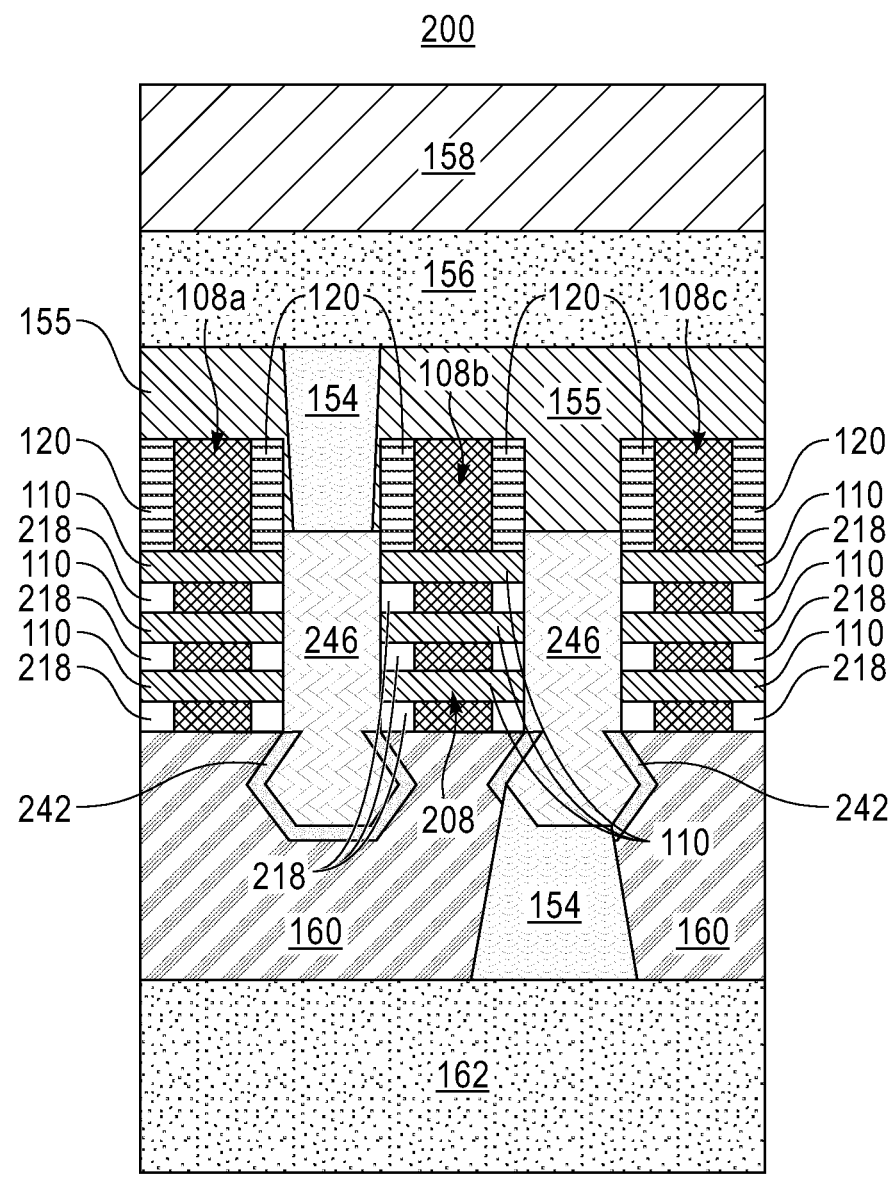
FIGS. 16A-16C depict cross-sectional side views of a semiconductor structure at one stage of fabrication, in accordance with one embodiment of the present invention.
Figure 16C:
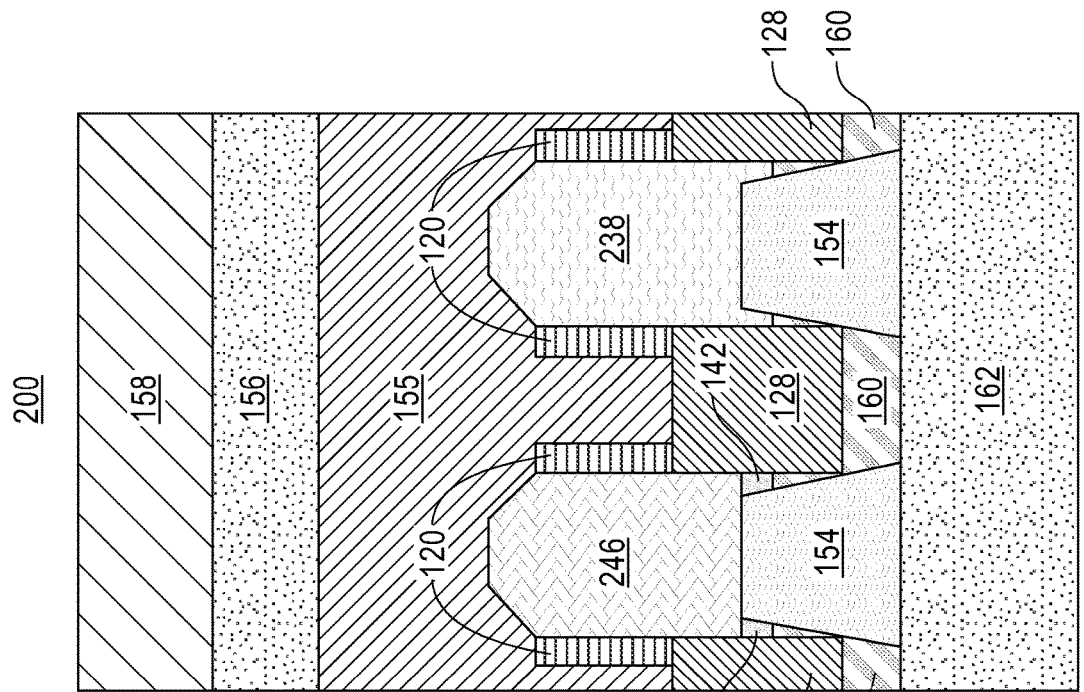
Figure 16B:
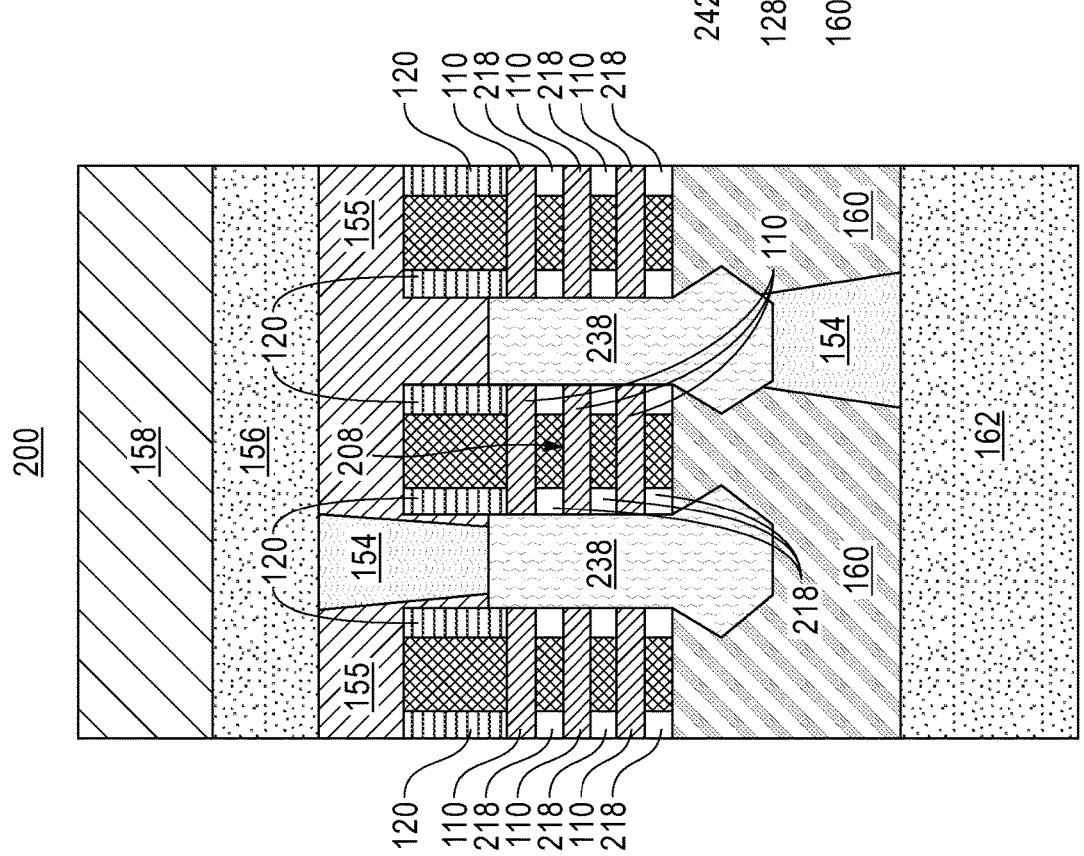

FIGS. 16A-16C depict cross-sectional side views of a semiconductor structure 200, in accordance with one embodiment of the present invention. The cross-sectional views are indicated in FIG. 1: FIG. 16A is a view along line A-A', FIG. 16B is a view along line B-B', and FIG. 16C is a view along line C-C'. The illustrated stage of the semiconductor structure 200 includes an alternative or additional shape of a PFET S/D 238 and a NFET S/D 246 that is a result of a Si sigma shaped etch process used to form recesses at process step described in FIG. 5A-5C. The sigma shape of the S/Ds 238, 246 enables a widened portion without having the S/Ds 238, 246 overlapping inner spacers 218 of a gate 208. The NFET S/D 246 of the illustrated embodiment also includes a SiGe epi 242 that protects the NFET S/D 246 during the selective etch process that removes the Si-based substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a PFET source/drain (S/D) comprising:
     a silicon germanium (SiGe)-based epi protruding through a BILD plane between a backside interlayer dielectric (BILD) and a first gate;
   an NFET S/D comprising:
     a silicon (Si)-based epi protruding into the BILD plane; and
     a SiGe epi between the BILD and the Si-based epi, wherein the NFET S/D comprises a first critical dimension (CD) between the first gate and a second gate, and a second CD below the BILD plane, wherein the first CD is smaller than the second CD.

2. The semiconductor structure of claim 1, further comprising a backside PFET contact electrically connecting the PFET S/D to a backside power delivery network.

3. The semiconductor structure of claim 1, further comprising a backside NFET contact electrically connecting the NFET S/D to a backside power delivery network through the SiGe epi.

4. The semiconductor structure of claim 1, further comprising a gate between the NFET S/D and a second NFET S/D, wherein the gate comprises a high-K metal gate (HKMG) that contacts the BILD.

5. The semiconductor structure of claim 1, wherein the PFET S/D comprises a third CD between the first gate and a third gate, and a fourth CD below the BILD plane, wherein the first CD is smaller than the second CD.

6. The semiconductor structure of claim 1, wherein the SiGe epi wraps around the Si-based epi and fully insulates the NFET S/D from the BILD.

7. A method, comprising:
   forming nanosheet fins above a substrate at a first critical dimension (CD);
   forming a first recess in the substrate between a first pair of the nanosheet fins, wherein the first recess comprises a second CD below the nanosheet fins;
   forming a silicon germanium (SiGe) liner within the recess;
   forming a NFET epi within the SiGe epi; and
   removing traces of the SiGe epi from channel layers of the nanosheet fins.

8. The method of claim 7, further comprising:
   forming a second recess in the substrate between a second pair of the nanosheet fins, wherein the second recess comprises the second CD; and
   forming a PFET epi within the second recess.

9. The method of claim 8, further comprising forming a backside S/D contact electrically connected to the PFET epi.

10. The method of claim 7, wherein forming the first recess in the substrate between the first pair of the nanosheet fins comprises:
    forming a protective liner on the nanosheet fins;
    etching the first recess vertically into the substrate in a first step; and
    etching the first recess laterally in a second step after the first step.

11. The method of claim 7, further comprising forming a backside S/D contact electrically connected to the NFET epi.

12. The method of claim 7, further comprising replacing the substrate with a backside interlayer dielectric (BILD).

13. A semiconductor structure, comprising:
an NFET source/drain (S/D) comprising:
- a silicon (Si)-based epi protruding into a BILD plane between a backside interlayer dielectric (BILD) and a first gate; and
- a SiGe epi between the BILD and the Si-based epi; and
- a backside NFET contact electrically connecting the NFET S/D to a backside power delivery network, wherein the NFET S/D comprises a first critical dimension (CD) between the first gate and a second gate, and a second CD below the BILD plane, wherein the first CD is smaller than the second CD, and wherein the second CD comprises a width of the SiGe epi.

14. The semiconductor structure of claim 13, further comprising a gate between the NFET S/D and a second NFET S/D, wherein the gate comprises a high-k metal gate (HKMG) that contacts the BILD.

15. The semiconductor structure of claim 13, wherein the SiGe epi wraps around the Si-based epi and fully insulates the NFET S/D from the BILD.

16. The semiconductor structure of claim 13, further comprising a PFET S/D comprising a SiGe-based epi protruding into the BILD plane and a backside PFET contact electrically connecting the PFET S/D to the backside power delivery network.

17. The semiconductor structure of claim 16, further comprising a gate between the PFET S/D and a second PFET S/D, wherein the gate comprises a high-K metal gate (HKMG) that contacts the BILD.

* * * * *